United States Patent
Tian et al.

(10) Patent No.: US 8,906,262 B2
(45) Date of Patent: *Dec. 9, 2014

(54) METAL SILICATE HALIDE PHOSPHORS AND LED LIGHTING DEVICES USING THE SAME

(75) Inventors: Yongchi Tian, Princeton Junction, NJ (US); Perry Niel Yocom, Washington Crossing, PA (US); Sawsan Aziz, Hackettstown, NJ (US); Olga Zakharov, Princeton, NJ (US); Alison Sides, Newtown, PA (US)

(73) Assignee: Lightscape Materials, Inc., Princeton, NJ (US)

( * ) Notice: Subject to any disclaimer, the term of this patent is extended or adjusted under 35 U.S.C. 154(b) by 2066 days.

This patent is subject to a terminal disclaimer.

(21) Appl. No.: 11/527,835

(22) Filed: Sep. 27, 2006

(65) Prior Publication Data
US 2007/0125982 A1    Jun. 7, 2007

Related U.S. Application Data

(60) Provisional application No. 60/741,982, filed on Dec. 2, 2005.

(51) Int. Cl.
| | |
|---|---|
| *C09K 11/08* | (2006.01) |
| *C09K 11/66* | (2006.01) |
| *C09K 11/56* | (2006.01) |
| *C09K 11/61* | (2006.01) |
| *H01J 1/62* | (2006.01) |
| *H01J 63/04* | (2006.01) |
| *C09K 11/77* | (2006.01) |
| *C09K 11/02* | (2006.01) |
| *H01L 33/50* | (2010.01) |

(52) U.S. Cl.
CPC ............ *C09K 11/7734* (2013.01); *C09K 11/025* (2013.01); *H01L 33/502* (2013.01)

USPC ....... 252/301.4 H; 252/301.4 F; 252/301.4 S; 313/503

(58) Field of Classification Search
CPC ........... C09K 11/7719; C09K 11/7721; C09K 11/7741; C09K 11/7727; C09K 11/7781; C09K 11/7706; C09K 11/7749; C09K 11/7758; C09K 11/7764; C09K 11/7774; C09K 11/7792
USPC ....... 252/301.4 H, 301.4 R, 301.4 S, 301.4 F; 313/503
See application file for complete search history.

(56) References Cited

U.S. PATENT DOCUMENTS

| 3,790,490 A | 2/1974 | Datta et al. |
|---|---|---|
| 4,710,033 A | 12/1987 | Hirano et al. |

(Continued)

FOREIGN PATENT DOCUMENTS

| GB | 864343 | 4/1961 |
|---|---|---|
| GB | 1087655 | 4/1965 |

(Continued)

OTHER PUBLICATIONS

Wang. Influence of InGaN/GaN quantum-well structure on the performance of light-emitting diodes and laser diodes grown on sapphire substrates. Journal of Crystal Growth 224 (2001) 5-10.*

(Continued)

*Primary Examiner* — Matthew E Hoban
(74) *Attorney, Agent, or Firm* — Thomas S. Deibert

(57) ABSTRACT

The present invention relates to certain metal silicate halide (halosilicate) phosphors, the phosphors with an oxide coating, methods of making the phosphors, and light emitting diode- (LED-) based lighting devices modified with the phosphors.

19 Claims, 5 Drawing Sheets

(56) References Cited

U.S. PATENT DOCUMENTS

| | | | |
|---|---|---|---|
| 5,140,163 A * | 8/1992 | Tecotzky et al. | 250/484.4 |
| 5,608,554 A | 3/1997 | Do et al. | |
| 5,958,591 A | 9/1999 | Budd | |
| 5,959,316 A | 9/1999 | Lowery | |
| 5,998,925 A | 12/1999 | Shimizu et al. | |
| 6,066,861 A | 5/2000 | Hohn et al. | |
| 6,069,440 A | 5/2000 | Shimizu et al. | |
| 6,084,250 A | 7/2000 | Juestel et al. | |
| 6,155,699 A | 12/2000 | Miller et al. | |
| 6,212,213 B1 | 4/2001 | Weber et al. | |
| 6,234,648 B1 | 5/2001 | Borner et al. | |
| 6,245,259 B1 | 6/2001 | Hohn et al. | |
| 6,252,254 B1 | 6/2001 | Soules et al. | |
| 6,255,670 B1 | 7/2001 | Srivastava et al. | |
| 6,273,589 B1 | 8/2001 | Weber et al. | |
| 6,277,301 B1 | 8/2001 | Hohn et al. | |
| 6,278,135 B1 | 8/2001 | Srivastava et al. | |
| 6,294,800 B1 | 9/2001 | Duggal et al. | |
| 6,303,403 B1 | 10/2001 | Sato et al. | |
| 6,351,069 B1 | 2/2002 | Lowery et al. | |
| 6,366,018 B1 | 4/2002 | Garbuzov et al. | |
| 6,373,188 B1 | 4/2002 | Johnson et al. | |
| 6,396,081 B1 | 5/2002 | Tews et al. | |
| 6,417,019 B1 | 7/2002 | Mueller et al. | |
| 6,429,583 B1 | 8/2002 | Levinson et al. | |
| 6,501,100 B1 | 12/2002 | Srivastava et al. | |
| 6,501,102 B2 | 12/2002 | Mueller-Mach et al. | |
| 6,504,179 B1 | 1/2003 | Ellens et al. | |
| 6,513,949 B1 | 2/2003 | Marshall et al. | |
| 6,521,915 B2 | 2/2003 | Odaki et al. | |
| 6,544,438 B2 | 4/2003 | Yocom et al. | |
| 6,555,022 B2 * | 4/2003 | Hampden-Smith et al. | 252/301.4 R |
| 6,577,073 B2 | 6/2003 | Shimizu et al. | |
| 6,586,882 B1 | 7/2003 | Harbers | |
| 6,596,195 B2 | 7/2003 | Srivastava et al. | |
| 6,603,258 B1 | 8/2003 | Mueller-Mach et al. | |
| 6,616,862 B2 | 9/2003 | Srivastava et al. | |
| 6,621,211 B1 | 9/2003 | Srivastava et al. | |
| 6,632,379 B2 | 10/2003 | Mitomo et al. | |
| 6,649,946 B2 | 11/2003 | Bogner et al. | |
| 6,670,748 B2 | 12/2003 | Ellens et al. | |
| 6,682,207 B2 | 1/2004 | Weber et al. | |
| 6,682,663 B2 | 1/2004 | Botty et al. | |
| 6,685,852 B2 | 2/2004 | Setlur et al. | |
| 6,686,691 B1 | 2/2004 | Mueller et al. | |
| 6,692,136 B2 | 2/2004 | Marshall et al. | |
| 6,695,982 B2 | 2/2004 | Ellens et al. | |
| 6,696,703 B2 | 2/2004 | Mueller-Mach et al. | |
| 6,717,353 B2 | 4/2004 | Mueller et al. | |
| 6,734,467 B2 | 5/2004 | Schlereth et al. | |
| 6,773,629 B2 | 8/2004 | Le Mercier et al. | |
| 6,783,700 B2 | 8/2004 | Tian et al. | |
| 6,791,259 B1 | 9/2004 | Stokes et al. | |
| 6,809,347 B2 | 10/2004 | Tosch et al. | |
| 6,809,471 B2 | 10/2004 | Setlur et al. | |
| 6,811,813 B1 | 11/2004 | Tian et al. | |
| 6,850,002 B2 | 2/2005 | Danielson et al. | |
| 6,936,857 B2 | 8/2005 | Doxsee et al. | |
| 6,939,481 B2 | 9/2005 | Srivastava et al. | |
| 6,943,380 B2 | 9/2005 | Ota et al. | |
| 6,982,523 B2 | 1/2006 | Odaki | |
| 7,002,291 B2 | 2/2006 | Ellens et al. | |
| 7,015,510 B2 | 3/2006 | Srivastava et al. | |
| 7,018,565 B2 | 3/2006 | Tian et al. | |
| 7,023,019 B2 | 4/2006 | Maeda et al. | |
| 7,029,602 B2 | 4/2006 | Oshio | |
| 7,064,480 B2 | 6/2006 | Booker et al. | |
| 7,091,653 B2 | 8/2006 | Ouderkirk et al. | |
| 7,091,661 B2 | 8/2006 | Ouderkirk et al. | |
| 7,125,501 B2 | 10/2006 | Tian et al. | |
| 7,276,183 B2 * | 10/2007 | Tian | 252/301.4 F |
| 7,321,191 B2 * | 1/2008 | Setlur et al. | 313/487 |
| 7,713,442 B2 * | 5/2010 | Tian et al. | 252/301.4 R |
| 2001/0038426 A1 | 11/2001 | Bechtel et al. | |
| 2003/0146690 A1 | 8/2003 | Ellens et al. | |
| 2003/0222268 A1 | 12/2003 | Yocom et al. | |
| 2003/0227007 A1 | 12/2003 | Ezuhara et al. | |
| 2003/0228412 A1 | 12/2003 | Chen | |
| 2004/0007961 A1 | 1/2004 | Srivastava et al. | |
| 2004/0116033 A1 | 6/2004 | Ouderkirk et al. | |
| 2004/0135504 A1 | 7/2004 | Tamaki et al. | |
| 2004/0145288 A1 | 7/2004 | Ouderkirk et al. | |
| 2004/0145289 A1 | 7/2004 | Ouderkirk et al. | |
| 2004/0145312 A1 | 7/2004 | Ouderkirk et al. | |
| 2004/0145895 A1 | 7/2004 | Ouderkirk et al. | |
| 2004/0145913 A1 | 7/2004 | Ouderkirk et al. | |
| 2004/0150991 A1 | 8/2004 | Ouderkirk et al. | |
| 2004/0159846 A1 | 8/2004 | Doxee et al. | |
| 2004/0159900 A1 | 8/2004 | Ouderkirk et al. | |
| 2004/0164307 A1 | 8/2004 | Mueller-Mach et al. | |
| 2004/0206973 A1 | 10/2004 | Tian et al. | |
| 2004/0212291 A1 | 10/2004 | Keuper | |
| 2004/0227465 A1 | 11/2004 | Mankara et al. | |
| 2004/0245532 A1 | 12/2004 | Maeda et al. | |
| 2005/0184638 A1 | 8/2005 | Mueller et al. | |
| 2005/0199897 A1 | 9/2005 | Setlur et al. | |
| 2005/0205845 A1 | 9/2005 | Delsing et al. | |
| 2005/0211992 A1 | 9/2005 | Nomura et al. | |
| 2005/0218780 A1 | 10/2005 | Chen | |
| 2005/0218781 A1 | 10/2005 | Chen | |
| 2005/0224828 A1 | 10/2005 | Oon et al. | |
| 2005/0230689 A1 | 10/2005 | Setlur et al. | |
| 2005/0239227 A1 | 10/2005 | Aanegola et al. | |
| 2005/0253158 A1 | 11/2005 | Yasukawa et al. | |
| 2005/0264161 A1 | 12/2005 | Oaku et al. | |
| 2006/0012284 A1 | 1/2006 | Kim et al. | |
| 2006/0012287 A1 | 1/2006 | Tian et al. | |
| 2006/0022582 A1 | 2/2006 | Radkov | |
| 2006/0027781 A1 | 2/2006 | Dong et al. | |
| 2006/0027785 A1 | 2/2006 | Wang et al. | |
| 2006/0027786 A1 | 2/2006 | Dong et al. | |
| 2006/0028122 A1 | 2/2006 | Wang et al. | |
| 2006/0033081 A1 | 2/2006 | Hintzen et al. | |
| 2006/0038477 A1 | 2/2006 | Tamaki et al. | |
| 2006/0049414 A1 | 3/2006 | Chandran et al. | |
| 2006/0055315 A1 | 3/2006 | Booker et al. | |
| 2006/0061252 A1 | 3/2006 | Sohn et al. | |
| 2006/0071589 A1 | 4/2006 | Radkov | |
| 2006/0097245 A1 | 5/2006 | Aanegola et al. | |
| 2006/0103291 A1 | 5/2006 | Ellens et al. | |
| 2006/0113553 A1 | 6/2006 | Srivastava et al. | |
| 2006/0145123 A1 | 7/2006 | Li et al. | |
| 2006/0181192 A1 | 8/2006 | Radkov et al. | |

FOREIGN PATENT DOCUMENTS

| | | |
|---|---|---|
| GB | 1414381 | 11/1975 |
| JP | 2001 107036 | 4/2001 |
| KR | 2000 007067 | 2/2000 |
| WO | WO 97/48138 | 12/1997 |
| WO | 00/32982 A1 | 6/2000 |
| WO | WO 01/50500 | 7/2001 |
| WO | WO 2005/086239 | 9/2005 |
| WO | WO 2006/001297 | 1/2006 |
| WO | WO 2006/028104 | 3/2006 |
| WO | 2006/104860 A2 | 10/2006 |
| WO | 2007/018260 A1 | 2/2007 |

OTHER PUBLICATIONS

Yen. Inorganic Phosphors: Compositions Preparation and Optical Properties. CRC Press LLC. 2004. p. 81-85.*
Akella. SraLiSiO4F: Synthesis, Structure, and Eu2+ Luminescence. Chem. Mater. 1996, 7, 1299-1302.*
Zhang. Luminescence Properties and Energy Transfer of Eu 2+ Doped Ca8Mg(Si04)4Cl2 Phosphors. J. Electrochem. Soc., vol. 139, No. 2, Feb. 1992.*
PCT/US06/39907 International Search Report, Mar. 29, 2007.
Akella, A. and D. A. Keszler, "$Sr_2LiSiO_4F$: Synthesis, Structure, and $Eu^{2+}$ Luminescence," *Chem. Mater.* 7(7):1299-302 (1995).
Bando, K., et al., "Development and Application of High Bright White LED Lamp," *Tech Digest*, Phosphor Res. Soc., 264th Meeting, 5-14 (Nov. 29, 1996). [In Japanese with English Summary].

(56) References Cited

OTHER PUBLICATIONS

Burrus, H. L. et al., "Fluorescence of $Eu^2+$-Activated Alkaline Earth Halosilicates," *J. Luminescence* 3: 467-76 (1971).

Czaya, V. R. and G. Bissert, "Die Kristallstruktur von Tricalcium-monosilikatdichlorid ($Ca_2SiO_4 \cdot CaCl_2$)," *Acta Cryst.* B27:747-53 (1971). [In German with English Abstract].

Garcia, A. et al., "$Ba_5SiO_4Cl_6$:Eu, A New Blue-Emitting Photoluminescent Material with High Quenching Temperature," *J. Electrochem. Soc.: Solid-State Science and Technology* 126(10):1734-36 (Oct. 1979).

Golovastikov, N. I. and V. F. Kazak, "The Crystal Structure of Calcium Chlorosilicate $Ca_2SiO_3Cl_2$," *Sov. Phys. Crystallogr.* 22(5):549-51 (Sep.-Oct. 1977).

Hermoneit, B. et al., "Single Crystal Growth and Some Properties of the New Compound $Ca_3Si_2O_7 \cdot 1/3CaCl_2$," *J. Cryst. Growth* 52:660-62 (1981).

Lehmann, Willi, "Heterogeneous Halide-silica Phosphors", *J. Electrochem. Soc.: Solid-State Science and Technology*, p. 748-752, Jun. 1975.

Liu, J. et al., "$Eu^2+$-Doped High-Temperature Phase $Ca_3SiO_4Cl_2$: A Yellowish Orange Phosphor for White-Emitting Diodes," *J. Electrochem. Soc.*, 152(11): G880-84 (2005).

Nakamura S., et al., "Superbright Green InGaN Single-Quantum-Well-Structure Light-Emitting Diodes," *Jpn. J. Appl. Phys.* (Letters) 34 (Pt. 2, No. 10B):L1332-35 (Oct. 15, 1995).

Peters, T. E. and J. A. Baglio. "Luminescence and structural properties of thiogallate phosphors $Ce^{+3}$ and $Eu^{+2}$-activated phosphors. Part I." *J. Electrochem. Soc.* 19(2):230-36 (1972).

Peters, T. E. "Luminescent properties of thiogallate phosphors: II. $Ce^{+3}$-activated phosphors for flying spot applications," *J. Electrochem. Soc.* 119(12):1720-23 (1972).

Sun, J. et al., "Study on Luminescence Properties of Eu2+ in (Sr, Ca)$_4$Si$_3$O$_8$Cl$_4$ Host Lattice," *Guang Pu Xue Yu Guang Pu Fen Xi*, 25(11):1760-63 (Nov. 2005). [In Chinese with English Abstract].

Wanmaker, W. L. and J. G. Verriet, "Luminescence of Phosphors with $Ca_3SiO_4Cl_2$ as the Host Lattice," *Philips Res. Repts.* 28:80-83 (1973).

Winkler, A. et al., "On Chloride Silicates of Calcium, Strontium, and Barium," *Z. Anorg. Allg. Chem.* 504:89-94 (1983). [In German; German & English Abstracts Only].

Winkler, A. et al., "Two New Barium Bromide Silicates and the Molecular Constitution of their Silicate Anions," *Z. Anorg. Allg. Chem.* 542:131-36 (1986). [In German; German & English Abstracts Only].

Yen, W. M. and M. J. Weber, *Inorganic Phosphors-Composition, Preparation and Optical Properties*, CRC Press: Boca Raton, 2004, pp. 81-85.

Zhang, X. and X. Liu, "Luminescence Properties and Energy Transfer of $Eu^{2+}$ Doped $Ca_8Mg(SiO_4)_4Cl_2$ Phosphors," *J. Electrochem. Soc.* 139(2):622-25 (Feb. 1992).

Extended European Search Report for European Application 06816796, dated Nov. 2, 2009.

\* cited by examiner

METAL SILICATE HALIDE PHOSPHORS AND LED LIGHTING DEVICES USING THE SAME

CROSS-REFERENCE TO RELATED APPLICATION

This application claims priority benefit of U.S. Provisional Patent Application Ser. No. 60/741,982, filed Dec. 2, 2005, which is incorporated by reference herein in its entirety.

FIELD OF THE PRESENT INVENTION

The present invention relates to certain metal silicate halide (halosilicate) phosphors, the phosphors having a coating of oxide that renders the phosphor resistant to water-induced degradation, methods of making the phosphors, and light emitting diode- (LED-) based lighting devices modified with the phosphors.

BACKGROUND OF THE PRESENT INVENTION

In lighting applications, phosphors can be used to modify the wavelength of the light output. For example, a light emitting diode (LED) lighting device typically consists of a LED chip ("LED") and a phosphor or a blend of phosphors. The chip emits the primary light with higher photon energy while the phosphor emits a light with lower photon energy upon the excitation of the primary light. The phosphors can be used to modify the wavelength of the primary light. For example, with certain phosphors the emission of an ultraviolet (UV) or blue LED can be modified to produce other visible lights by positioning the phosphors along the emission pathway to convert the primary light to longer wavelengths. An appropriate blend of blue-, green- and red-emitting phosphors can be used to modify UV LED emission to white light (i.e., light of white chromaticity). Certain combinations of green- and red-emitting phosphors can be used to modify a blue output of a LED to white light. Yellow emitting phosphors can be mixed with light from a blue LED or a blue emitting phosphor to create light of white chromaticity. Light from other UV or blue emitting devices, such as fluorescent lamps, can be similarly modified by the phosphors. The phosphor described here, when matched with appropriate other light sources, can be used in such applications.

The phosphors of the present invention are comprised of at least one halosilicate, also called silicate halide, as a host crystal and certain transition metal ions and rare earth metal ions as activators. The halosilicate is a class of crystals in which both the silicate group and a halide ion are defining elements in determining the crystal structure. For example, the crystal $Ca_2SiO_4CaCl_2$ (see, e.g., V. R. Czaya and G. Bissert, *Acta Cryst.* B27, 747(1971)), $Ca_2SiO_3Cl_2$ (see, e.g., N. I. Golovastikov and V. F. Kazak, *Sov. Phys Crystallogr.*, 22(5), 549 (1977)) and $Sr_2LiSiO_4F$ (see, e.g., A. Akella and D. Keszler, *Chem. Mater.* 7, 1299, (1995)) are typical halosilicates. In the crystals, the silicate group, e.g., $[Si_2O_7]^{6-}$ and $[SiO_4]^{4-}$ and the halide ions, e.g., $Cl^-$ or $F^-$, constitute the compound in a definite stoichiometry and determine the crystal structures. In contrast, there are phosphors that are comprised of silicates and halide ions, but the halide ions exist as dopant, which does not determine the crystal structure but may cause slight modifications, such as, causing expansions or contractions of the lattice. The dopant is present in quantities less than the major defining ions of the halosilicate.

Certain metal silicate halide phosphors have been described, though without describing their suitability for LED applications. See for example:

| Ref. | Formula | λex | λem | Crystal Structure |
|---|---|---|---|---|
| Akella and Keszler, Chem. Mater. 7: 1299 (1995) | $Sr_2LiSiO_4F$:Eu | 380 | 520 | $P2_1/m$, monoclinic |
| Burrus and Nicholson, J. Lumin. 3: 467 (1971) | $Sr_2Si_3O_8 \cdot 2SrCl_2$:Eu | 410 | 505 | Not Reported (NR) |
| U.S. Pat. No. 3,790,490 (Datta et al.)(1974) | $Sr_5Si_4O_{10}Cl_6$:Eu, Mn | 370 | green | NR |
| Burrus and Nicholson (1971) | $Sr_4Si_3O_8Cl_2$:Eu | NR | NR | NR |
| Burrus and Nicholson (1971); GB 1,414,381 (King et al.) (1973); Wanmaker and Verriet, Philips Res. Repts. 28: 80 (1973) | $Ca_3SiO_4Cl_2$:Eu (or $Pb^{2+}$ or other activator candidates) | 370 | 515 brd | $P2_1/m$, monoclinic |
| Garcia et al., J. Electrochem. Soc., 126(10): 1734 (1979) | $Ba_5SiO_4Cl_6$:Eu | 410 | 440 | monoclinic, Cc |
| Garcia et al., J. Electrochem. Soc., 126(10): 1734 (1979) | $Ba_7Si_2O_7Cl_8$:Eu | 420 | Y-Grn | NR |
| Garcia et al., J. Electrochem. Soc., 126(10): 1734 (1979) | $Ba_5Si_2O_6Cl_6$:Eu | 420 | Y-Grn | NR |

These crystalline materials have been synthesized and their crystal structures have been determined by X-ray diffraction. Certain transition metal ions and rare earth metal ions can be doped as luminescent activators in these crystals.

Certain metal silicate halide minerals (non-phosphors) have been described. See for example:

| Ref. | Formula |
|---|---|
| A. Winkler, et al, Z. Anorg. Allg. Chem, 504, 89, (1983) | $Sr_5SiO_4Cl_6$ |
| A. Winkler, et al. (1983). | $Sr_5Si_2O_7Cl_4$ |
| A. Winkler, et al. (1983). | $Sr_8Si_4O_{12}Cl_8$ |
| A. Winkler, et al, Z. Anorg. Allg. Chem, 542, 131, (1986) | $Ba_7Si_2O_7Br_8$ |
| A. Winkler, et al. (1986). | $Ba_{15}Si_6O_{18}Cl$ |

A phosphor comprising these crystals has not been reported.

Thus, the present invention is directed to novel halosilicate phosphors and uses thereof in lighting devices including LED-containing lighting devices.

SUMMARY OF THE PRESENT INVENTION

The present invention provides a phosphor having a formula selected from:
a) $(M1_xM2_{1-x})_2LiSiO_4X:A$;
b) $(M1_xM2_{1-x})_5SiO_4X_6:A$;
c) $(M1_xM2_{1-x})_3SiO_4X_2:A$;
d) $(M1_xM2_{1-x})_5(SiO_4)_2X_2:A$;
e) $(M1_xM2_{1-x})_5Si_2O_7X_4:A$;
f) $(M1_xM2_{1-x})_{10}(Si_2O_7)_3X_2:A$;
g) $(M1_xM2_{1-x})_4Si_2O_7X_2:A$;
h) $M1_6M2_4(Si_2O_7)_3X_2:A$;
i) $(M1_xM2_{1-x})_7Si_2O_7X_8:A$;
j) $(M1_xM2_{1-x})_3Si_3O_8X_2:A$;
k) $(M1_xM2_{1-x})_4Si_3O_8X_4:A$;
l) $(M1_xM2_{1-x})_8Si_4O_{12}X_8:A$;
m) $(M1_xM2_{1-x})_5Si_2O_6X_6:A$;
n) $(M1_xM2_{1-x})_{10}Si_6O_{18}X_8:A$;
o) $(M1_xM2_{1-x})_5Si_4O_{10}X_6:A$;
p) $(M1_xM2_{1-x})_{10}(SiO_4)_3(SO_4)_3X_2:A$;
q) $(M1_xM2_{1-x})_4(SiO_4)(SO_4)X_2:A$; and
r) $(M1_xM2_{1-x})_8Mg(SiO_4)_4X_2:A$, where:
M1 and M2 are each independently at least one metal ion selected from the group consisting of $Mg^{2+}$, $Ca^{2+}$, $Sr^{2+}$, $Ba^{2+}$, $Zn^{2+}$ and $Cd^{2+}$;
x is a value from about 0.001 to about 1;
X is at least one halide ion in ionic form;
A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$;
if the phosphor has the formula $(M1_xM2_{1-x})_2LiSiO_4X:A$, and M1 is $Sr^{2+}$, x is 1 and X is fluoride or M2 is $Sr^{2+}$, x is 0 and X is fluoride, then A is not $Eu^{2+}$; and
if the phosphor has the formula $(M1_xM2_{1-x})_3SiO_4X_2:A$, and M1 is $Ca^{2+}$, x is 1 and X is chloride or M2 is $Ca^{2+}$, x is 0 and X is chloride, then A is not $Eu^{2+}$; and
if the phosphor has the formula $(M1_xM2_{1-x})_8Mg(SiO_4)_4X_2:A$, and M1 is $Ca^{2+}$, x is 1 and X is chloride or M2 is $Ca^{2+}$, x is 0 and X is chloride, then A is not $Eu^{2+}$.

In some embodiments, the phosphor of the present invention has a formula as previously described, where:
M1 and M2 are each independently $Ca^{2+}$, $Sr^{2+}$, $Ba^{2+}$ or a combination thereof;
X is fluoride, chloride, bromide or a combination thereof; and
A is $Eu^{2+}$, $Mn^{2+}$, $Ce^{3+}$ or combination thereof.

In some embodiments, the phosphor of the present invention has a formula as previously described, where:
M1 is $Ca^{2+}$;
M2 is $Sr^{2+}$, $Ba^{2+}$ or a combination thereof;
X is fluoride, chloride or a combination thereof; and
A is $Eu^{2+}$, $Mn^{2+}$, $Ce^{3+}$ or a combination thereof.

In some embodiments, the phosphor of the present invention has the formula:

$$(M1_xM2_{1-x})_3SiO_4X_2:A,$$

where x is a value from about 0.01 to about 1.

In some embodiments, the phosphor of the present invention has the formula:

$$(M1_xM2_{1-x})_8Mg(SiO_4)_4X_2:A,$$

where x is a value from about 0.01 to about 1.

In some embodiments, the phosphor of the present invention has the formula:

$$(Ca_xSr_{1-x})_3SiO_4X_2:A,$$

where:
x is a value from about 0.01 to about 1;
X is fluoride, chloride, bromide or a combination thereof; and
A is $Eu^{2+}$, $Mn^{2+}$, $Ce^{3+}$ or a combination thereof.

In some embodiments, the phosphor of the present invention has the formula:

$$(M1_xM2_{1-x})_8Mg(SiO_4)_4X_2:A,$$

where:
x is a value from about 0.01 to about 1;
X is fluoride, chloride, bromide or a combination thereof; and
A is $Eu^{2+}$, $Mn^{2+}$, $Ce^{3+}$ and a combination thereof.

In some embodiments, the phosphor of the present invention has the formula:

$$(Ca_xSr_{1-x})_3SiO_4Cl_2:Eu^{2+},$$

where:
x is a value from about 0.01 to about 1; and
$Eu^{2+}$ is of an amount from about 0.0001 mole to about 0.1 mole of the phosphor.

In some embodiments, the phosphor of the present invention has the formula:

$$(M1_xM2_{1-x})_8Mg(SiO_4)_4X_2:Eu^{2+},$$

where:
x is a value from about 0.01 to about 1; and
$Eu^{2+}$ is of an amount from about 0.0001 mole to about 0.1 mole of the phosphor.

The present invention further provides a coated phosphor comprising a phosphor of the present invention, as previously described, and at least one layer of a coating on the phosphor, wherein the layer comprises at least one oxide. In some embodiments, the coated phosphor of the present invention has a coating that comprises at least two layers of oxide.

The present invention further provides a lighting device comprising a phosphor of the present invention. In some embodiments, the lighting device comprises:
a) a light source that emits light at wavelengths of at least about 300 nm; and
b) at least one phosphor according to the present invention, wherein:
(1) the phosphor is capable of absorbing at least a portion of the light emitted from the light source;
(2) the phosphor modifies a chromaticity of the portion of the light absorbed from the light source; and (3) the phosphor emits light of a longer wavelength than that of the light absorbed from the light source.

In some embodiments, the phosphor of the lighting device of the present invention further comprises a coating that comprises at least one oxide.

In some embodiments, the lighting device of the present invention produces white light.

In some embodiments, the light source of the lighting device of the present invention is a light emitting diode (LED). In some such embodiments, the LED comprises a quantum well structure having a light emitting layer sandwiched between a p-type clad layer and an n-type clad layer.

In some embodiments of the lighting device of the present invention, the p-type clad layer is formed of $Al_qGa_{1-q}N$, wherein $0<q<1$, the n-type clad layer is formed of $Al_rGa_{1-r}N$, wherein $0 \leq r \leq 1$, and optionally, the p-type clad layer has a band gap that is larger than the band gap of the n-type clad layer.

In some embodiments, the LED of the lighting device of present invention comprises a light emitting layer containing indium and at least one quantum well structure.

In some embodiments, the lighting device of the present invention further comprises optionally, at least one quantum well structure that comprises at least one well layer of InGaN and at least one barrier layer of GaN, optionally, at least one quantum well structure that comprises at least, one well layer of InGaN and at least one barrier layer of AlGaN, and optionally, at least one quantum well structure that comprises at least one well layer of AlInGaN and at least one barrier layer of AlInGaN, where at least one barrier layer has a band gap energy larger than a band gap energy of at least one well layer and optionally, the well layer has a thickness of at most about 100 angstroms.

In some embodiments, at least one phosphor of the lighting device of the present has a formula where:
M1 and M2 are each independently $Ca^{2+}$, $Sr^{2+}$, $Ba^{2+}$ or a combination thereof;
X is fluoride, chloride, bromide or a combination thereof; and
A is $Eu^{2+}$, $Mn^{2+}$, $Ce^{3+}$ or a combination thereof.

In some embodiments, at least one phosphor of the lighting device of the present has a formula where:
M1 is $Ca^{2+}$;
M2 is $Sr^{2+}$, $Ba^{2+}$ or a combination thereof;
X is fluoride, chloride or a combination thereof; and
A is $Eu^{2+}$, $Mn^{2+}$, $Ce^{3+}$ or a combination thereof.

In some embodiments, at least one phosphor of the lighting device of the present has the formula:

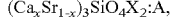
$(Ca_xSr_{1-x})_3SiO_4X_2:A$, where:
x is a value from about 0.01 to about 1;
X is fluoride, chloride, bromide or a combination thereof; and
A is $Eu^{2+}$, $Mn^{2+}$, $Ce^{3+}$ or a combination thereof.

In some embodiments, at least one phosphor of the lighting device of the present has the formula:

$(M1_xM2_{1-x})_8Mg(SiO_4)_4X_2:A$, where:
x is a value from about 0.01 to about 1;
X is fluoride, chloride, bromide or a combination thereof; and
A is Eu, $Mn^{2+}$, $Ce^{3+}$ or combination thereof.

In some embodiments, at least one phosphor of the lighting device of the present has the formula:

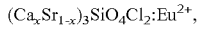
$(Ca_xSr_{1-x})_3SiO_4Cl_2:Eu^{2+}$, where:
x is a value from about 0.01 to about 1; and
$Eu^{2+}$ is of an amount from about 0.0001 mole to about 0.1 mole of the phosphor.

In some embodiments, at least one phosphor of the lighting device of the present has a formula:

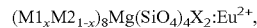
$(M1_xM2_{1-x})_8Mg(SiO_4)_4X_2:Eu^{2+}$, wherein:
x is a value from about 0.01 to about 1; and
$Eu^{2+}$ is of an amount from about 0.0001 mole to about 0.1 mole of the phosphor.

In some embodiments, the lighting device of the present further comprises at least one additional phosphor having formula (I):

$$CaSiO_3 \cdot (SiO_2)_n : R \in, Y \qquad (I)$$

where:
$R \in$ is at least one activator ion selected from the group consisting of $Eu^{2+}$ and $Mn^{2+}$; and
Y is at least one halide ion in ionic or atomic form or is absent.

In some embodiments, the lighting device of the present further comprises at least one additional phosphor comprises formula (II):

$$CaSiO_3(SiO_2)_n:Eu^{2+},I^- \qquad (II)$$

and the additional phosphor emits blue light.

In some embodiments, the lighting device of the present further comprises at least one additional phosphor comprises formula (III):

$$CaSiO_3(SiO_2)_n:Eu^{2+},Mn^{2+},I^- \qquad (III)$$

and the additional phosphor emits red light.

In some embodiments, the lighting device of the present invention further comprises at least two additional phosphors, wherein:
one phosphor comprises formula (II):

$$CaSiO_3(SiO_2)_n:Eu^{2+},I^-, \qquad (II)$$

and the second phosphor comprises formula (III)

$$CaSiO_3(SiO_2)_n:Eu^{2+},Mn^{2+},I^- \qquad (III).$$

In some embodiments, the lighting device of the present invention emits white light.

In some embodiments, the lighting device of the present invention comprises:
a) a light source that emits light at wavelengths of at least about 300 nm, wherein the light source is a light emitting diode (LED); and
b) at least one phosphor of the present invention, wherein:
(1) the phosphor is capable of absorbing at least a portion of the light emitted from the light source;
(2) the phosphor modifies a chromaticity of the portion of the light absorbed from the light source;
(3) the phosphor emits light of a longer wavelength than that of the light absorbed from the light source; and
(4) optionally, the phosphor further comprises at least one layer of a coating that comprises at least one oxide, wherein the lighting device produces white light.

DETAILED DESCRIPTION OF THE PRESENT INVENTION

Figure 1:
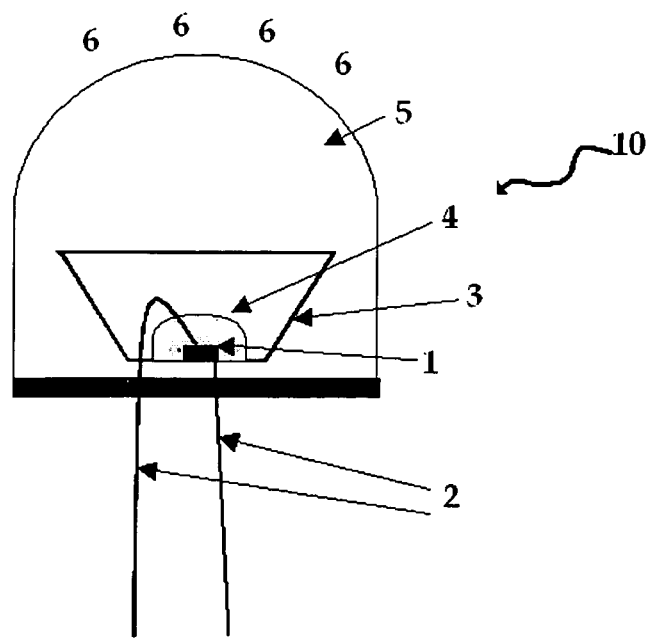
FIGS. 1-3 show light emitting devices that can be used in the present invention.

As used herein, "activator" refers to an ion that determines the wavelength of light emission from the phosphor of which the activator is a part.

As used herein, a "coating," "oxide coating," or "coating of oxide" refers to a covering or outside layer(s) comprising (a) at least one oxide (e.g., amorphous or crystalline), (b) lacks optically distinguishable embedded particles, and (c) is sufficiently complete as to provide relative protection against water, such as, a coating that maintains about 80% of a phosphor's original optical performance after exposure to about 85° C. and about 85% relative humidity for about 16 hours to about 100 hours. Such coatings can contain other elements and compounds, such as, those originating in the coating precursor (i.e., antecedent or predecessor) materials or phosphor particles. Accordingly, "oxide," as used herein, refers to such materials that comprise metal or semiconductor cations and oxygen, which often is the primary material of the coating.

As used herein, "particle" refers to an individual crystal of phosphor.

As used herein, "grain" refers to an agglomeration, aggregation, polycrystalline or polymorph of phosphor particles, where the particles are not easily separated as compared to phosphor particles of a powder.

Temperatures described herein for processes involving a substantial gas phase are of the oven or other reaction vessel in question, not of the reactants per se.

"White light," as used herein, refers to light of certain chromaticity coordinates on the Commission Internationale de l'Éclairage (CIE) 1931 Diagram, which are well-known in the art.

The present invention provides, amongst other things, a phosphor according to a formula selected from:

(a) $(M1_xM2_{1-x})_2LiSiO_4X{:}A$;
(b) $(M1_xM2_{1-x})_5SiO_4X_6{:}A$;
(c) $(M1_xM2_{1-x})_3SiO_4X_2{:}A$;
(d) $(M1_xM2_{1-x})_5(SiO_4)_2X_2{:}A$;
(e) $(M1_xM2_{1-x})_5Si_2O_7X_4{:}A$;
(f) $(M1_xM2_{1-x})_{10}(Si_2O_7)_3X_2{:}A$;
(g) $(M1_xM2_{1-x})_4Si_2O_7X_2{:}A$;
(h) $M1_6M2_4(Si_2O_7)_3X_2{:}A$;
(i) $(M1_xM2_{1-x})_7Si_2O_7X_8{:}A$;
(j) $(M1_xM2_{1-x})_3Si_3O_8X_2{:}A$;
(k) $(M1_xM2_{1-x})_4Si_3O_8X_4{:}A$;
(l) $(M1_xM2_{1-x})_8Si_4O_{12}X_8{:}A$;
(m) $(M1_xM2_{1-x})_5Si_2O_6X_6{:}A$;
(n) $(M1_xM2_{1-x})_{10}Si_6O_{18}X_8{:}A$;
(o) $(M1_xM2_{1-x})_5Si_4O_{10}X_6{:}A$;
(p) $(M1_xM2_{1-x})_{10}(SiO_4)_3(SO_4)_3X_2{:}A$;
(q) $(M1_xM2_{1-x})_4(SiO_4)(SO_4)X_2{:}A$; and
(r) $(M1_xM2_{1-x})_8Mg(SiO_4)_4X_2{:}A$, where:
M1 and M2 are each independently at least one metal ion selected from the group consisting of $Mg^{2+}$, $Ca^{2+}$, $Sr^{2+}$, $Ba^{2+}$, $Zn^{2+}$ and $Cd^{2+}$;
x is a value from about 0.001 to about 1;
X is at least one halide ion in ionic form;
A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$;
if the phosphor has the formula $(M1_xM2_{1-x})_2LiSiO_4X{:}A$, and M1 is $Sr^{2+}$, x is 1 and X is fluoride or M2 is $Sr^{2+}$, x is 0 and X is fluoride, then A is not $Eu^{2+}$; and
if the phosphor has the formula $(M1_xM2_{1-x})_3SiO_4X_2{:}A$, and M1 is $Ca^{2+}$, x is 1 and X is chloride or M2 is $Ca^{2+}$, x is 0 and X is chloride, then A is not $Eu^{2+}$; and
if the phosphor has the formula $(M1_xM2_{1-x})_8Mg(SiO_4)_4X_2{:}A$, and M1 is $Ca^{2+}$, x is 1 and X is chloride or M2 is $Ca^{2+}$, x is 0 and X is chloride, then A is not $Eu^{2+}$.

In some embodiments, the activator ion can substitute for a portion (for example and without limitation, about 1% to about 10%) of the metal strontium, barium or calcium in the host crystal lattice. In some embodiments, the activator ion can substitute for about 4% of the metal strontium, barium or calcium in the host crystal lattice.

In some embodiments, A can be replaced by A', which is the same as A, except that when the activator includes $Eu^{2+}$, at least one additional activator ion is present in an amount effective to change the fluorescence feature (e.g., emission wavelength or bandwidth or both) of the phosphor.

In some embodiments, A can be replaced by A", which is the same as A, except that when the activator includes $Eu^{2+}$, $Mn^{2+}$ or a combination thereof, at least one additional activator ion is present in an amount effective to change the fluorescence feature (e.g., emission wavelength or bandwidth or both) of the phosphor.

In some embodiments, A can be replaced by A*, which is the same as A, except that when the activator includes $Eu^{2+}$, $Pb^{2+}$, $Mn^{2+}$, $Bi^{3+}$, $Ce^{3+}$, $Tb^{3+}$, $Dy^{3+}$, or a combination thereof, at least one additional activator ion is present in an amount effective to change the fluorescence feature (e.g., emission wavelength or bandwidth or both) of the phosphor.

In some embodiments of the phosphor of the present invention, A has a mole percentage of about 0.001% to about 10%. In some embodiments, the range of the mole percentage of A is from one of the following lower endpoints (inclusive or exclusive): about 0.001%, about 0.01%, about 0.02%, about 0.05%, about 0.1%, about 0.2%, about 0.5%, about 1%, about 2%, about 3%, about 4% and about 5% mole and from one of the following upper endpoints (inclusive or exclusive): about 0.01%, about 0.02%, about 0.05%, about 0.1%, about 0.2%, about 0.5%, about 1%, about 2%, about 3%, about 4%, about 5% and about 10% mole. For example, the range can be from about 0.01% to about 5% mole. It will be understood by those of ordinary skill in the art that A can in fact substitute for the primary (i.e., principal or main) metal components of the phosphor—nonetheless, the primary metal components, if recited in relative amounts, are recited normalized, as if the combined primary metals were present in formula amounts as would pertain absent A.

In some embodiments, the emission peak for a phosphor of the present invention is measured with the emission source being lit at about 440 nm±100 nm or about 400 nm±100 nm.

In some embodiments, the emission range for a phosphor of the present invention is, for example, and without limitation, from one of the following lower endpoints (inclusive or exclusive) of: about 300 nm, about 301 nm, about 302 nm, about 303 nm, and each one rum increment up to about 799 nm, and from one of the following upper endpoints (inclusive or exclusive) of: about 800 nm, about 799 nm, about 798 nm, about 797 nm, and each one nm down to about 381 nm. In some embodiments, the lower endpoint of the emission range is, for example, and without limitation, about 400 nm, about 401 nm, about 402 nm, and each one nm increment up to about 799 nm.

In some embodiments, the excitation peak range for a phosphor of the present invention is, for example, and without limitation, from one of the following lower endpoints (inclusive or exclusive) of: about 200 nm, about 201 nm, about 202 nm, about 203 nm, and each one nm increment up to about 549 nm and from one of the following upper endpoints (inclusive or exclusive): about 550 nm, about 549 nm, about 548 nm, about 547 nm, and each one nm down to about 201 nm.

The present invention further provides the phosphors of the present invention having an oxide coating. In some embodiments, a coated phosphor comprises (1) a phosphor of the present invention, and (2) a coating comprising at least one layer, where the layer comprises at least one oxide. The layer(s) of the coating render the phosphor relatively more resistant to water-induced degradation as compared to an uncoated phosphor. That is to say, the layer(s) of the coating increases the resistance of the phosphor to degradation stimulated by water (in all its forms), such as, and without limitation, the coated phosphor maintains about 80% of its original optical performance after exposure to about 85° C. and about 85% relative humidity for about 100 hours.

In some embodiments, the oxide of the coating of the coated phosphor of the present invention is titanium oxide, aluminum oxide, zirconium oxide, tin oxide, boron oxide, silicon oxide, zinc oxide, germanium oxide, aluminum silicate, $Al_8BSi_3O_{19}(OH)$, $B_2Al_2(SiO_4)_2(OH)$, $ZnAl_2O_4$, $Al_2SiO_5$, $Al_4(SiO_4)_3$, $ZrSiO_4$, or combinations thereof. In some embodiments, the oxide is titanium oxide, aluminum oxide or silicon oxide.

In some embodiments, the coating of the coated phosphor of the photoluminescent phosphor of the present invention has at least two layers. In some embodiments, each layer independently comprises an oxide chosen from titanium oxide, aluminum oxide, silicon oxide and a combination thereof. In some embodiments, one layer of the coating comprises titanium oxide.

In some embodiments, the coating of the coated phosphor of the photoluminescent phosphor of the present invention is continuous.

In some embodiments, the oxide layer of the coating of the present invention comprises predominantly (e.g., ≥about 60%) one type of oxide (as determined by the metal or semiconductor component), e.g., layer of titanium oxide, aluminum oxide, or silicon oxide. In some embodiments, the coating of the present invention comprises two or more layers that are predominantly one type of oxide. For example, the layers can be made separately of two or more titanium oxides, aluminum oxides, or silicon oxides. In some embodiments, one layer of the coating of the present invention is of silicon oxide, and another is of a titanium oxide or aluminum oxide.

In some embodiments, the coating of the phosphor of the present invention can be a single layer of one type of oxide, for example, a titanium oxide; or, the coating can be multi-layer, i.e., comprising more than one layer or at least two layers, with the layers, independently of each other, comprising a different type of oxide or oxide combination, for example, one layer can comprise an aluminum oxide and one layer can comprise a silicon oxide.

In some embodiments, the coating of the phosphor of the present invention can be substantially transparent (such that useful fluorescence is retained) and are typically between about 0.1 micron and about 3.0 microns thick or between about 0.05 micron and about 0.50 micron thick. Coatings that are too thin (e.g., at least less than about 0.005 micron (5 nm) thick) can tend to provide insufficient impermeability to moisture, i.e., the coating fails to provide a phosphor protection from moisture whereby the phosphor degrades and loses its photoluminescence. Coatings that are too thick (e.g., greater than about 3.0 microns thick) can tend to be less transparent and result in reduced brightness of the coated phosphor.

In some embodiments, the amount of protection provided by the coating of phosphor of the present invention can be measured by the amount of original emission intensity retained over a period of time at about 85° C. and about 85% humidity. In some embodiments, the coated phosphors retain at least about 40%; at least about 45%; at least about 50%; at least about 55%; at least about 60%; at least about 65%; at least about 70%; at least about 75%; at least about 80% photoluminescence when subjected to these conditions for at least about 30 mins., at least about 1 hour, or at least about 2 hours. In some embodiments, the coated phosphors retain at least about 40%; at least about 45%; at least about 50%; at least about 55%; at least about 60%; at least about 65%; at least about 70%; at least about 75%; or at least about 80% of original emission intensity when subjected to these conditions for at least about 4 hours; at least about 8 hour; at least about 12 hours; at least about 16 hours; at least about 24 hours; at least about 48 hours; or at least about 96 hours.

Additionally provided by the present invention is a method of coating a phosphor of the present invention with an oxide coating, the method comprising: (a) providing a phosphor of the present invention, and (b) exposing the phosphor to oxide precursors and water to yield at least one layer of coating that renders the phosphor relatively more resistant to water-induced degradation than when it is uncoated. The method of coating coats particles and grains of phosphor.

In some embodiments, the phosphor particles (and/or grains) are coated by agitating or suspending them so that all sides have substantially equal exposure (i.e., the majority, e.g., about ≥50% of the surfaces of the phosphor particles are exposed) to certain coating vapor or liquid during the period of the coating operation. For example, and without limitation, the particles can be suspended in a fluidized bed, or agitated or stirred in a liquid. Gas used to fluidize the particles can include the vapor used to coat the particles. For example, and without limitation, the gas can include an inert gas carrier (i.e., a gas that is non-reactive under normal circumstances) and the coating vapor. Carrier gas can be passed through vessel(s) of predominately (i.e., principally, for the most part or primarily, such as, ≥about 60%) liquid or solid form precursor to carry away vapor for use in the coating. The vessel(s) and connecting pathways can be heated as needed to maintain sufficient vapor pressure.

Where two or more oxide precursors are used in forming the same coating layer, carrier gas can be passed separately through vessels of the separate precursors and mixed prior to, or in, the coating reaction chamber of a reaction vessel. Relative carrier gas flow rates through the separate vessels can be adjusted to carry the desired amount of precursor in light of vapor pressure or empirical coating results. Water vapor is carried similarly to the reaction vessel, with an amount moderated similarly, as appropriate. In liquid-mediated coating methods, any number of dispensing methods can be used to incorporate multiple precursors into the liquid.

Coating can be accomplished through a hydrolysis to form a surface oxide, with the hydrolysis occurring in a vapor phase and/or in a liquid phase. An example of the former is chemical vapor deposition (CVD), while of the latter is a sol-gel process.

In vapor phase deposition reactions (i.e., a hydrolytic deposition reaction), the uncoated phosphor particles can be floated by a carrier gas in a reaction chamber to disperse the particles as substantially single particles (e.g., more than 95 percent (>95%) of the particles have no association, agglomeration or aggregation). The chamber can be heated to an appropriate temperature given the reactants (e.g., in some implementations, about 200° C.). Coating precursor materials in the vapor phase then are introduced into the chamber. Under the temperature conditions, at least a portion of precursor (e.g., about 20%) is decomposed hydrolytically to form an oxide layer on the surfaces of the phosphor particles, thereby microencapsulating them. A typical hydrolysis that can be used in the present invention is as follows:

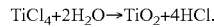

$$TiCl_4 + 2H_2O \rightarrow TiO_2 + 4HCl.$$

In liquid phase depositions (i.e., a hydrolytic deposition reaction), an uncoated phosphor powder (comprising phosphor particles and/or grains) can be suspended in an inert fluid medium (i.e., a medium having a limited ability to react chemically) containing coating precursor. The powder is stirred such that the particles are dispersed sufficiently so as to form a suspension and have little probability to form an agglomerate. As used herein, "suspension" refers to a colloidal mixture wherein one substance (i.e., the dispersed medium) is finely dispersed within another substance (i.e., the dispersion medium). A small amount of water then can be added to the suspension to initiate hydrolysis. If needed, the reaction is accelerated by an elevated temperature, e.g., about 70° C. The hydrolysis results in a formation of an oxide coating on the surfaces of the phosphor particles. For example, the following reaction can be used for coating $SiO_2$ on SCS particles:

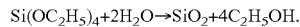

$$Si(OC_2H_5)_4 + 2H_2O \rightarrow SiO_2 + 4C_2H_5OH.$$

In some embodiments, the method of coating a phosphor comprises a hydrolytic deposition reaction, where the hydrolytic deposition reaction is conducted at a temperature selected (in light of the given phosphor) to retain useful fluorescence (e.g., having an optical performance of about ≥80% of its uncoated version). The temperature of a vapor phase deposition can be, for example, from about 25° C. to about 400° C. The temperature can be, for example, at least about 25° C., at least about 50° C., at least about 75° C., at least about 100° C., at least about 150° C., or at least about 200° C. The temperature can be, for example, at most about 400° C., at most about 300° C., at most about 275° C., at most about 250° C., at most about 225° C., or at most about 200° C. The temperature of a liquid phase deposition can be, for example, from about 25° C. to about 90° C., depending on the reactants, the solvent, and the stability of the phosphor to the temperature. The temperature can be, for example, at least about 25° C., at least about 30° C., at least about 35° C., at least about 40° C., at least about 45° C., at least about 50° C., at least about 55° C., at least about 60° C., at least about 65° C., or at least about 70° C. The temperature can be, for example, at most about 90° C., at most about 85° C., at most about 80° C., at most about 75° C., at most about 70° C., at most about 65° C., at most about 60° C., at most about 55° C., or at most about 50° C. The temperature is, of course, lower than the boiling point of the solvent at the operative pressure.

Oxides useful in the coating of the coated phosphors of the present invention are, for example, and without limitation, titanium oxides (e.g., $TiO_2$), aluminum oxide (e.g., $Al_2O_3$), zirconium oxide (e.g., $ZrO_2$), tin oxides (e.g., $SnO_2$), boron oxide (e.g., $B_2O_3$), silicon oxide (e.g., $SiO_2$), zinc oxide (e.g., ZnO), germanium oxide (e.g., $GeO_2$), tantalum oxide (e.g., $Ta_2O_5$), niobium oxide (e.g., $Nb_2O_5$), hafnium oxide (e.g., $HfO_2$), gallium oxide (e.g., $Ga_2O_3$), and the like. Further oxides useful in the coatings of the coated phosphors of the present invention include oxides formed with more than one type of cation, for example, aluminum silicate [such as, $3Al_2O_3.2SiO_2$ or in mullite form], $Al_8BSi_3O_{19}(OH)$ [such as, in dunortierite form], $B_2Al_2(SiO_4)_2(OH)$ [such as, in euclase form], $ZnAl_2O_4$ [such as, in gahnite form], $Al_2SiO_5$ [such as, in sillimanite form], $ZrSiO_4$ [such as, in zircon form], and the like. In some embodiments, for use in the method of coating a phosphor of the present invention, volatile or appropriately soluble precursors that hydrolytically generate the oxides are used. Such precursors are known in the art.

Volatile precursors include, for example, and without limitation, halogenated metals (e.g., titanium tetrachloride ($TiCl_4$) and silicon tetrachloride ($SiCl_4$)), alkylated metals (e.g., trimethylaluminum, ($Al(CH_3)_3$), trimethylboron ($B(CH_3)_3$), tetramethylgermanium, $Ge(CH_3)_4$) and tetraethylzirconium, $Zr(C_2H_5)_4$, mixed halo (i.e., comprising fluoride, chloride, bromide, iodine or astatine) and alkyl derivatives of metals (e.g., dimethylaluminum chloride, diethyldichlorsilane), metal or semiconductor alkoxide (e.g., titanium (IV) methoxide and tetraethylorthosilicate (TEOS)). With the aid of vapor water, these compounds can be hydrolyzed to yield their respective oxides. As used herein, "halogenated metals" refers to metal cations and anions of group VII elements of the periodic table of chemical elements that are ionically or valently bonded. As used herein, "alkylated metals" refers to metal cations and anions comprising at least one $C_1$ to $C_{16}$ straight or branched moiety, such as, methyl, diethyl, propyl, isopropyl, butyl, tert-butyl, pentyl, hexyl, octyl, nonyl and decyl. As used herein, "alkyl" refers to a saturated hydrocarbon group that is unbranched (i.e., straight-chained) or branched (i.e., non-straight chained). Example alkyl groups, without limitation, include methyl (Me), ethyl (Et), propyl (e.g., n-propyl and isopropyl), butyl (e.g., n-butyl, isobutyl, t-butyl), pentyl (e.g., n-pentyl, isopentyl, neopentyl), and the like. In some embodiments of the present invention, an alkyl group can contain from about 1 to about 10, from about 2 to about 8, from about 3 to about 6, from about 1 to about 8, from about 1 to about 6, from about 1 to about 4, from about 1 to about 3 carbon atoms, or from about 1, 2, 3, 4, 5, 6, 7, 8, 9 or 10 carbon atoms. As used herein, "alkoxide" refers to an alkyl-O-moiety, wherein alkyl is as previously defined.

Soluble precursors include, for example, metal or semiconductor alkoxides, (e.g. titanium (IV) methoxide and zirconium (IV) butoxide). Such compounds can form oxides by hydrolysis.

The present invention further provides a lighting device comprising at least one phosphor of the present invention. In some such embodiments, the lighting device further comprises a light source. As used herein, "light source" refers to a Group III-V semiconductor quantum well-based light emitting diode or a phosphor other than a phosphor of the present invention.

In some embodiments, the lighting device of the present invention is a white LED lamp. In some such embodiments, the white LED lamp comprises a LED, two or more phosphors, and is pumped with blue light or near LV light. As used herein, "near UV light" refers to light having a wavelength range from about 350 nm to about 420 nm. In some such embodiments, the white LED lamp delivers a high CRI of at least about 84, a high efficiency of at least about 90% and long lifetimes of at least about 100,000 hours.

In some embodiments, the lighting device of the present invention comprises at least one LED, which emits light having a wavelength of at least 250 nm, and at least one phosphor of the present invention, which has a formula as described herein, where the phosphor(s) is located between the LED and the light output for the device.

In some such embodiments, the lighting device can further comprise at least one additional phosphor. The additional phosphor(s) can assist in achieving a desired chromaticity. The additional phosphor can have a formula as disclosed in U.S. patent application Ser. No. 11/149,648 (Y. Tian), i.e., having the formula (I):

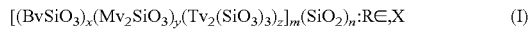

$$[(BvSiO_3)_x(Mv_2SiO_3)_y(Tv_2(SiO_3)_3)_z]_m(SiO_2)_n:R{\in},X \qquad (I)$$

where x, y and z are each any value such that x+y+z=1, Bv is at least one divalent alkaline earth metal ion, Mv is at least one monovalent alkaline metal ion, Tv is at least one trivalent metal ion, $R{\in}$ is at least one activator selected from $Eu^{2+}$ and $Mn^{2+}$ ions, X is at least one halide ion in ionic or atomic form, and m is 1 or 0, provided that if m is 1 and provides an amount of silica effective to host efficient luminescence, then n is greater than 3, or if m=0, then n is 1. As used herein, "efficient luminescence" refers to an emission invisible light (wavelength ranging from about 400 nm to about 750 nm) with quantum efficiency higher than about 40%.

Other additional phosphors that can be used with phosphors of the present invention include, for example: $Y_3Al_5O_{12}:Ce^{3+}$(YAG), $Lu_3Ga_2(AlO_4)_3:Ce^{3+}$, $La_3In_2(AlO_4)_3:Ce^{3+}$, $Ca_3Ga_5O_{12}:Ce^{3+}$, $Sr_3Al_5O_{12}:Tb^{3+}$, $BaYSiAlO_{12}:Ce^{3+}$, $CaGa_2S_4:Eu^{2+}$, $SrCaSiO_4:Eu^{2+}$, $ZnS:Cu$, $CaSi_2O_2N:Eu^{2+}$, $SrSi_2O_2N:Eu^{2+}$, $SrSiAl_2O_3N_2:Eu^{2+}$, $Ba_2MgSi_2O_7:Eu^{2+}$, $Ba_2SiO_4:Eu^{2+}$, $La_2O_3.11Al_2O_3:Mn^{2+}$, $Ca_8Mg(SiO_4)_4Cl_4:Eu^{2+}$, $Mn^{2+}$, $(CaM)(Si, Al)_{12}(O, N)_{16}:Eu^{2+}$, $Tb^{3+}$, $Yb^{3+}$, $YBO_3:Ce^{3+}$, $Tb^{3+}$, $BaMgAl_{10}O_{17}:Eu^{2+}$, $Mn^{2+}$, $(Sr, Ca, Ba)(Al, Ga)_2S_4:Eu^{2+}$, $BaCaSi_7N_{10}:Eu^{2+}$, $(SrBa)_3MgSi_2O_8:Eu^{2+}$, $(SrBa)_2P_2O_7:Eu^{2+}$, $(SrBa)_2Al_{14}O_{25}:Eu^{2+}$, $LaSi_3N_5:Ce^{3+}$, $(BaSr)MgAl_{10}O_{17}:Eu^{2+}$, and $CaMgSi_2O_7:Eu^{2+}$.

In some embodiments of the lighting device of the present invention, the phosphor(s) are located between the light source and the light output for the device, In some embodiments, the light source of the lighting device of the present invention can, for example, comprise a gallium nitride-based LED with a light emitting layer comprising a quantum well structure. In some embodiments, the light source can include a reflector located to direct light from the LED or phosphor. In some embodiments, the phosphor can be located on the surface of the LED or separate therefrom. In some embodiments, the light source can further include a translucent material encapsulating the phosphor and optionally, a portion (for example and without limitation, about 30%) of the emission light of the LED from which the light output emerges.

When used in a lighting device, it will be recognized that the phosphors of the present invention can be excited by light from a primary source, such as, a semiconductor light source (e.g., a LED) emitting in a wavelength range of about 250 nm to about 500 nm or about 300 nm to about 420 nm, or by light from a secondary light source, such as, emissions from additional phosphor(s) that emit in the wavelength range of about 250 nm to about 500 nm or about 300 nm to about 420 nm. Where the excitation light is secondary, in relation to the phosphors of the present invention, the excitation-induced light is the relevant source light. Devices that use the phosphor of the present invention can include, for example, and without limitation, mirrors, such as, dielectric mirrors, which direct light produced by the phosphors of the present invention to the light output, rather than direct such light to the interior of the device (such as, the primary light source).

In some embodiments, the semiconductor light source (e.g., a LED chip) of the lighting device of the present invention emits light of at least about 250 nm, at least about 255 nm, at least about 260 nm, and so on in increments of about 1 nm to at least about 500 nm. The semiconductor light source, in some embodiments, emits light of at most about 500 nm, at most about 495 nm, at most about 490 nm, and so on, in increments of about 1 nm, to at most about 300 nm.

In some embodiments, phosphors of the present invention can be dispersed in the lighting device of the present invention with a binder, a solidifier, a dispersant (i.e., a light scattering material), a filler or the like. The binder can be, for example, and without limitation, a light curable polymer, such as, an acrylic resin, an epoxy resin, a polycarbonate resin, a silicone resin, a glass, a quartz and the like. The phosphor of the present invention can be dispersed in the binder by methods known in the art. For example, in some embodiments, the phosphor can be suspended in a solvent with the polymer suspended, dissolved or partially dissolved in the solvent, thus forming a slurry, which then can be dispersed on the lighting device and the solvent evaporated therefrom. In some embodiments, the phosphor can be suspended in a liquid, such as, a pre-cured precursor to the resin to form a slurry, the slurry then can be dispersed on the lighting device and the polymer (resin) cured thereon. Curing can be, for example, by heat, UV, or a curing agent (such as, a free radical initiator) mixed with the precursor. As used herein "cure" or "curing" refers to, relates to or is a process for polymerizing or solidifying a substance or mixture thereof, often to improve stability or usability of the substance or mixture thereof.

In some embodiments, the binder used to disperse the phosphor(s) in a lighting device can be liquefied with heat, thereby, a slurry is formed, and then the slurry is dispersed on the lighting device and allowed to solidify in situ. Dispersants include, for example, and without limitation, titanium oxides, aluminum oxides, barium titanates, silicon oxides, and the like.

In some embodiments, the lighting device of the present invention comprises a semiconductor light source, such as a LED, to either create excitation energy, or to excite another system to thereby provide the excitation energy for the phosphor of the present invention. Devices using the present invention can include, for example, and without limitation, white light producing lighting devices, indigo light producing lighting devices, blue light producing lighting devices, green light producing lighting devices, yellow light producing lighting devices, orange light producing lighting devices, pink light producing lighting devices, red light producing lighting devices, or lighting devices with an output chromaticity defined by the line between the chromaticity of a photoluminescent phosphor of the present invention and that of at least one second light source. Headlights or other navigation lights for vehicles can be made with the lighting devices of the present invention. The lighting devices can be output indicators for small electronic devices, such as cell phones and personal digital assistants (PDAs). The lighting devices of the present invention also can be the backlights of the liquid crystal displays for cell phones, PDAs and laptop computers. Given appropriate power supplies, room lighting can be based on devices of the invention. The warmth (i.e., amount of yellow/red chromaticity) of lighting devices of the present invention can be tuned by selection of the ratio of light from a phosphor of the present invention to light from a second source (including, a second photoluminescent phosphor of the present invention).

Suitable semiconductor light sources for use in the present invention also include those that create light that excites the phosphors of the present invention, or that excites a different phosphor that in turn excites the phosphors of the present invention. Such semiconductor light sources can be, for example, and without limitation, GaN (gallium nitride) type semiconductor light sources, In—Al—Ga—N type semiconductor light sources ($In_iAl_jGa_kN$, where i+j+k=about 1, where two or more of i, j and k can be 0), BN, SiC, ZnSe, BAlGaN, and BInAlGaN light sources, and the like. The semiconductor light source (e.g., a semiconductor chip) can be based, for example, on III-V or II-VI quantum well structures (meaning structures comprising compounds that combine elements of the Periodic Table of the Chemical Elements, such as, elements from Group III with those from Group V or elements from Group II with those from Group VI). In some embodiments, a blue light or a near UV light emitting semiconductor light source is used.

In some embodiments, a semiconductor light source of the lighting device of the present invention has at least two different phosphors, and disperses the phosphors separately, superimposing the phosphors as layers instead of dispersing the phosphors together in one matrix. Such layering can be used to obtain a final light emission color by way of a plurality of color conversion processes. For example, the light emission process is: absorption of the light emission of a semiconductor light source by a first phosphor of the present invention, light emission by the first phosphor, absorption of the light emission of the first phosphor by a second phosphor, and the light emission by the second phosphor. In some embodiments, the second phosphor is a phosphor of the present invention. In some embodiments, the second phosphor is not a phosphor of the present invention.

Figure 4:
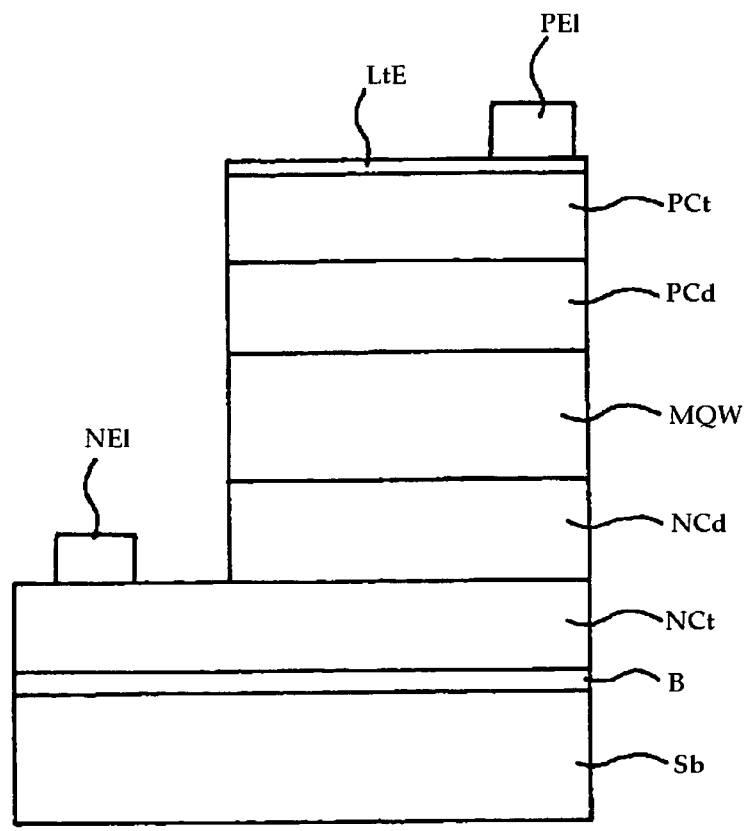
FIG. 4 shows a LED that can be used in the present invention.

FIG. 4 shows an exemplary layered structure of a semiconductor light source. The semiconductor light source comprises a substrate Sb, such as, for example, a sapphire substrate. For example, a buffer layer B, an n-type contact layer NCt, an n-type cladding layer NCd, a multi-quantum well active layer MQW, a p-type cladding layer PCd, and a p-type contact layer PCt are formed in that order as nitride semiconductor layers. The layers can be formed, for example, by organometallic chemical vapor deposition (MOCVD) on the substrate Sb. Thereafter, a light-transparent electrode LtE is formed on the whole surface of the p-type contact layer PCt, a p electrode PEl is formed on a part of the light-transparent electrode LtE, and an n electrode NEl is formed on a part of the n-type contact layer NCt. These layers can be formed, for example, by sputtering or vacuum deposition.

The buffer layer B can be formed of, for example, AlN, and the n-type contact layer NCt can be formed of, for example, GaN.

The n-type cladding layer NCd can be formed, for example, of $Al_rGa_{1-r}N$ where 0≤r<1, the p-type cladding layer PCd can be formed, for example, of $Al_qGa_{1-q}N$ where 0<q<1, and the p-type contact layer PCt can be formed, for example, of $Al_sGa_{1-s}N$ wherein 0≤s<1 and s<q. The band gap of the p-type cladding layer PCd is made larger than the band gap of the n-type cladding layer NCd. The n-type cladding layer NCd and the p-type cladding layer PCd each can have a single-composition construction, or can have a construction such that the above-described, nitride semiconductor layers having a thickness of not more than about 100 angstroms and different from each other in composition are stacked on top of each other so as to provide a superlattice structure. When the layer thickness is not more than about 100 angstroms, the occurrence of cracks or crystal defects in the layer can be prevented.

The multi-quantum well active layer MQW can be composed of a plurality (i.e., at least two) of InGaN well layers and a plurality of GaN barrier layers. The well layer and the barrier layer can have a thickness of not more than about 100 angstroms, such as, for example, about 60 angstroms to about 70 angstroms, so as to constitute a superlattice structure. Since the crystal of InGaN is softer than other aluminum-containing nitride semiconductors, such as, AlGaN, the use of InGaN in the layer constituting the active layer MQW can offer an advantage that all the stacked nitride semiconductor layers are less likely to crack. The multi-quantum well active layer MQW can also be composed of a plurality of InGaN well layers and a plurality of AlGaN barrier layers. Or, the multi-quantum well active layer MQW can be composed of a plurality of AlInGaN well layers and a plurality of AlInGaN barrier layers. In this case, the band gap energy of the barrier layer can be made larger than the band gap energy of the well layer.

In some embodiments, the light source of the present invention comprises a reflecting layer on the substrate Sb side from the multi-quantum well active layer MQW, for example, on the buffer layer B side of the n-type contact layer NCt. The reflecting layer also can be provided on the surface of the substrate Sb remote (i.e., at a distance) from the multi-quantum well active layer MQW stacked on the substrate Sb. The reflecting layer can have a maximum reflectance with respect to light emitted from the active layer MQW and can be formed of, for example, aluminum, or can have a multi-layer structure of thin GaN layers. The provision of the reflecting layer can permit light emitted from the active layer MQW to be reflected from the reflecting layer, can reduce the internal absorption of light emitted from the active layer MQW, can increase the quantity of light output toward above (i.e., going out of the device, or a direction toward the outside world and away from the substrate), and can reduce the incidence of light on the mount for the light source to prevent deterioration.

Figure 2:
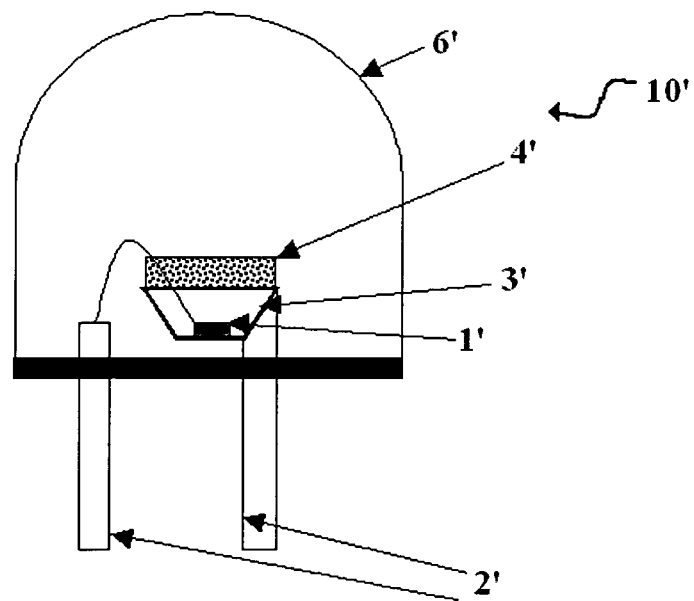
Figure 3:
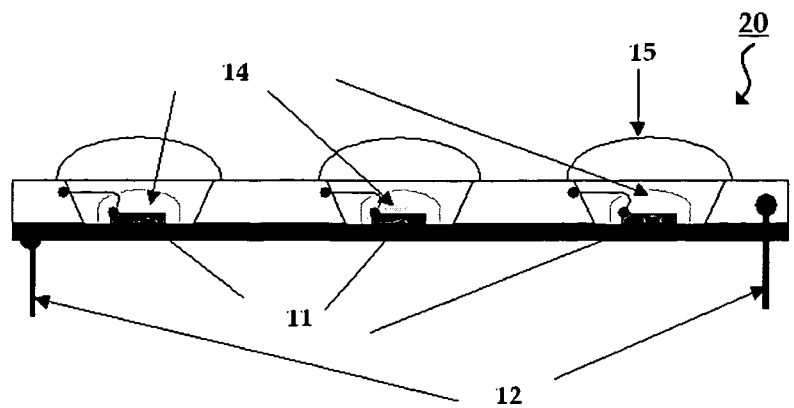

Shown in FIGS. 1-3 are some exemplary structures of the lighting device of the present invention comprised of a LED and phosphors. FIG. 1 shows a light emitting device 10 with an LED chip 1 (i.e., primary light source) powered by leads 2, and having phosphor-containing material 4 secured between the LED chip and the final light output 6. A reflector 3 can serve to concentrate light output. A transparent envelope 5 can isolate the LED chip and phosphor from the environment and/or provide a lens. FIG. 2 shows a light emitting device 10' with a LED chip 1' powered by leads 2', and having phosphor-containing material 4' secured between the LED chip and the final light output 6', in this case above reflector 3'. The reflector, and the location of the phosphor-containing material away from the LED chip, can serve to concentrate final light output. A transparent envelope 5' can isolate the LED chip and phosphor from the environment and/or provide a lens. The lighting device 20 of FIG. 3 has multiple LED chips 11, leads 12, phosphor-containing material 14, and transparent envelope 15.

The leads 2, 2', 12 can comprise thin wires supported by a thicker lead frame or the leads can comprise self-supported electrodes and the lead frame can be omitted. The leads provide current to the LED chip, and thus, cause the LED chip to emit radiation.

It will be understood by those of ordinary skill in the art that there are any number of ways to associate phosphors with a semiconductor light source (e.g., a LED light source) such that light from the semiconductor light source is managed by its interaction with the phosphors. U.S. Published Patent Applications Nos. 2004/0145289 (A J Ouderkirk et al.) and 2004/0145288 (A J Ouderkirk et al.) illustrate lighting devices where a phosphor is positioned away from the light output of the semiconductor light sources. U.S. Pat. No. 6,982,523 (T. Odaki), U.S. Pat. No. 6,936,857 (D. Doxsee et al.) and U.S. Published Patent Application No. 2004/00135504 (H. Tamaki et al.) further illustrates, without limitation, lighting devices that can be used in the present invention.

Semiconductor light source-based white light devices can be used, for example, in a self-emission type display for displaying a predetermined pattern or a graphic design on a display portion of an audio system, a household appliance, a measuring instrument, a medical appliance, and the like. Such semiconductor light source-based light devices also can be used, for example, and without limitation, as light sources of a back-light for a liquid crystal diode (LCD) display, a printer head, a facsimile, a copying apparatus, and the like.

The present invention also provides a method of making a phosphor having a formula selected from:

(a) $(M1_xM2_{1-x})_2LiSiO_4X:A$;
(b) $(M1_xM2_{1-x})_5SiO_4X_6:A$;
(c) $(M1_xM2_{1-x})_3SiO_4X_2:A$;
(d) $(M1_xM2_{1-x})_5(SiO_4)_2X_2:A$;
(e) $(M1_xM2_{1-x})_5Si_2O_7X_4:A$;
(f) $(M1_xM2_{1-x})_{10}(Si_2O_7)_3X_2:A$;
(g) $(M1_xM2_{1-x})_4Si_2O_7X_2:A$;
(h) $M1_6M2_4(Si_2O_7)_3X_2:A$;
(i) $(M1_xM2_{1-x})_7Si_2O_7X_8:A$;
(j) $(M1_xM2_{1-x})_3Si_3O_8X_2:A$;
(k) $(M1_xM2_{1-x})_4Si_3O_8X_4:A$;
(l) $(M1_xM2_{1-x})_8Si_4O_{12}X_8:A$;
(m) $(M1_xM2_{1-x})_5Si_2O_6X_6:A$;
(n) $(M1_xM2_{1-x})_3Si_6O_{18}X_8:A$;
(o) $(M1_xM2_{1-x})_5Si_4O_{10}X_6:A$;
(p) $(M1_xM2_{1-x})_{10}(SiO_4)_3(SO_4)_3X_2:A$;
(q) $(M1_xM2_{1-x})_4(SiO_4)(SO_4)X_2:A$; and
(r) $(M1_xM2_{1-x})_8Mg(SiO_4)_4X_2:A$, where:

M1 and M2 are each independently at least one metal ion selected from the group consisting of $Mg^{2+}$, $Ca^{2+}$, $Sr^{2+}$, $Ba^{2+}$, $Zn^{2+}$ and $Cd^{2+}$;

x is a value from about 0.001 to about 1;

X is at least one halide ion in ionic form;

A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$;

if the phosphor has the formula $(M1_xM2_{1-x})_2LiSiO_4X:A$, and M1 is $Sr^{2+}$, x is 1 and X is fluoride or M2 is $Sr^{2+}$, x is 0 and X is fluoride, then A is not $Eu^{2+}$; and if the phosphor has the formula $(M1_xM2_{1-x})_3SiO_4X_2:A$, and M1 is $Ca^{2+}$, x is 1 and X is chloride or M2 is $Ca^{2+}$, x is 0 and X is chloride, then A is not $Eu^{2+}$; and if the phosphor has the formula $(M1_xM2_{1-x})_8Mg(SiO_4)_4X_2:A$, and M1 is $Ca^{2+}$, x is 1 and X is chloride or M2 is $Ca^{2+}$, x is 0 and X is chloride, then A is not $Eu^{2+}$;

the method comprising the steps of:

1) providing a metal silicate that is a precursor to the phosphor having a formula shown above;
2) providing at least one activator ion from those described above;
3) optionally, providing at least one halide ion in ionic or atomic form;
4) mixing the metal silicate and activator ion with the metal halide ion, which is in ionic or atomic form, to form a mixture; and heating the mixture to produce the phosphor.

Methods to make the phosphors include, for example, heating a mixture consisting of the constituents of a targeted phosphor, and/or of compounds (precursors) which react to produce such constituents during the heating. The mixture optionally includes a proportion of metal halide (in ionic or atomic form) in excess of that required to be incorporated in the final product. Mixing can be combined with grinding to assure intimate mixture. The heating can be continued for a period of about one hour or more at a temperature of about 600° C. or more, such as, about 800° C., about 900° C., or about 1000° C. The heating effects a reaction of the mixture to produce activator-containing metal silicate halide. A part of the heating process can be carried out in an inert or reducing atmosphere, to ensure that the activator is present in the targeted oxidation state in the final product. As used herein, the term "reducing" refers to the process in which electrons are added to an atom or ion (as by removing oxygen or adding hydrogen). The product of the heating step of the method of making a phosphor of the present invention is washed to remove excess metal halide (in ionic or atomic form), if present.

In some embodiments of the method of the present invention, the mixture produced may consist of compounds which react together during the heating to form at least one metal silicate, together with at least one activator oxide and at least one metal halide in ionic or atomic form.

In some embodiments, the method of the present invention further includes a second heating, optionally at a higher temperature than the first heating. In some such embodiments, the method further includes a grinding step in between the first heating and second heating steps. In some such embodiments, the range of heating temperature has, for example, a lower endpoint (inclusive or exclusive) of about 800° C., about 801° C., about 802° C., about 803° C., and so on in one ° C. increment up to about 1199° C. and an upper endpoint (inclusive or exclusive) of about 1200° C., about 1199° C., about 1198° C., about 1197° C., and so on in one ° C. increment down to about 801° C.

In some embodiments, the method of the present invention uses a solid solvent. In some such embodiments, the constituents or precursors, except the halide (ionic or atomic) and optionally, except the activator, are heated to form a precursor containing the mineral metal silicate, which lacks the halide component, and which optionally, lacks the activator component. The metal silicate is mixed (such as by grinding) with a metal halide (ionic or atomic) selected to form a liquid at a target temperature. The mixture is heated at the target temperature (which may be a range, i.e., a target temperature range) to obtain the phosphor. The metal halide (ionic or atomic) serves as solvent and provides the halide source. In some such embodiments, a range of heating temperature in a first heating step has, for example, a lower endpoint (inclusive or exclusive) of about 900° C., about 901° C., about 902° C., about 903° C., and so on in one ° C. increments up to about 1299° C. and an upper endpoint (inclusive or exclusive) of about 1300° C., about 1299° C., about 1298° C., about 1297° C., and so on in one ° C. increments down to about 901° C. In some such embodiments, the range of the target temperature has, for example, a lower endpoint (inclusive or exclusive) of about 800° C., about 801° C., about 802° C., about 803° C., and so on in one ° C. increments up to about 1199° C. and an upper endpoint (inclusive or exclusive) of about 1200° C., about 1199° C., about 1198° C., about 1197° C., and so on in one ° C. increments down to about 801° C. The resulting metal silicate halide can often be identified by powder x-ray diffraction, even in the presence of the metal halide (ionic or atomic). Useful metal halides (ionic and atomic) include, for example, $CaCl_2$, $SrCl_2$, $BaCl_2$, $CaBr_2$, $SrBr_2$, $BaBr_2$, $CaF_2$, $SrF_2$, $BaF_2$, $MgCl_2$, $MgBr_2$, $MgF_2$ or mixtures thereof, and the like.

EXAMPLES

The following examples are put forth so as to provide those of ordinary skill in the art with a complete disclosure and description of how to make and use the present invention, and are not intended to limit the scope of what the inventors regard as their invention nor are they intended to represent that the experiments below are all or the only experiments performed. Efforts have been made to ensure accuracy with respect to numbers used (e.g., amounts, temperature, etc.), but an account for some experimental errors and deviations should be made. Unless indicated otherwise, parts are parts by weight, molecular weight is average molecular weight, and temperature is in degrees Centigrade.

Example 1

Preparation of $(Ca,Sr)_3SiO_4Cl_2:Eu^{2+}$

Figure 5:
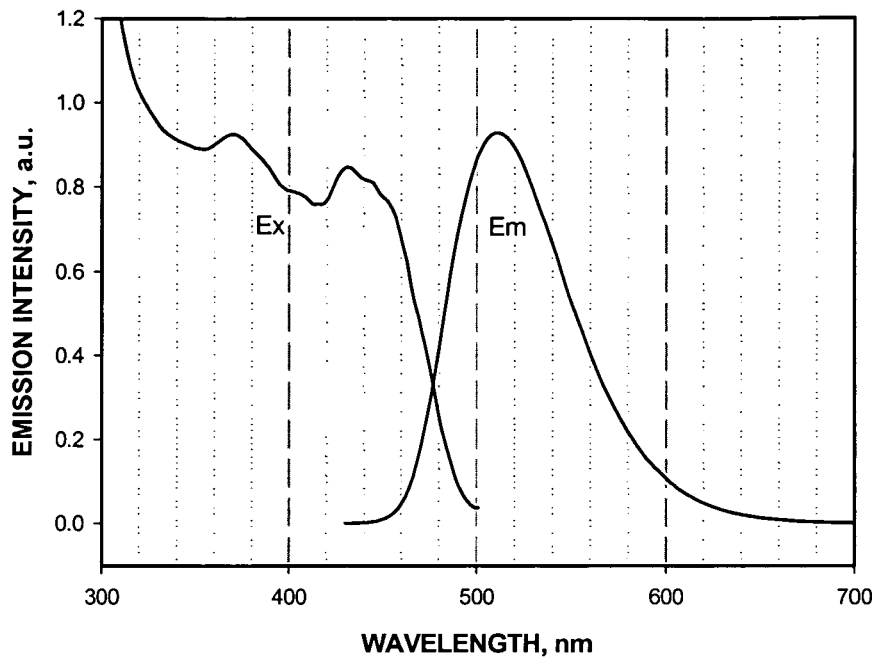
FIG. 5 shows emission/excitation spectra for phosphor Example 1 of the present invention.

The ingredient powders of $Eu_2O_3$ (0.66 g), $SiO_2$ (15.02 g), $CaCO_3$ (45.0 g) and $SrCO_3$ (7.38 g) were mixed and milled in a milling jar. The mixed powder then was fired at about 1000° C. for about 5 hours in an atmosphere of air. The fired powder was cooled and ground. Then, $CaCl_2$ (20 g) was added to and mixed with the fired powder in a mortar/pestle. The resultant powder then was fired at about 700° C. in a forming gas (5% $H_2/N_2$) for about 3 hours. The second fired powder then was mixed with $CaCl_2$ (10 g) and then fired at about 700° C. in a forming gas (5% $H_2/N_2$) for about 3 hours. The fluorescence excitation and emission spectra are shown in FIG. 5. The x-ray diffraction (XRD) pattern (FIG. 6) shows that the phosphor has the structure of $Ca_3SiO_4Cl_2$.

Example 2

Preparation of $(Ca,Sr)_8Mg(SiO_4)_4Cl_2:Eu^{2+}$

Figure 6:
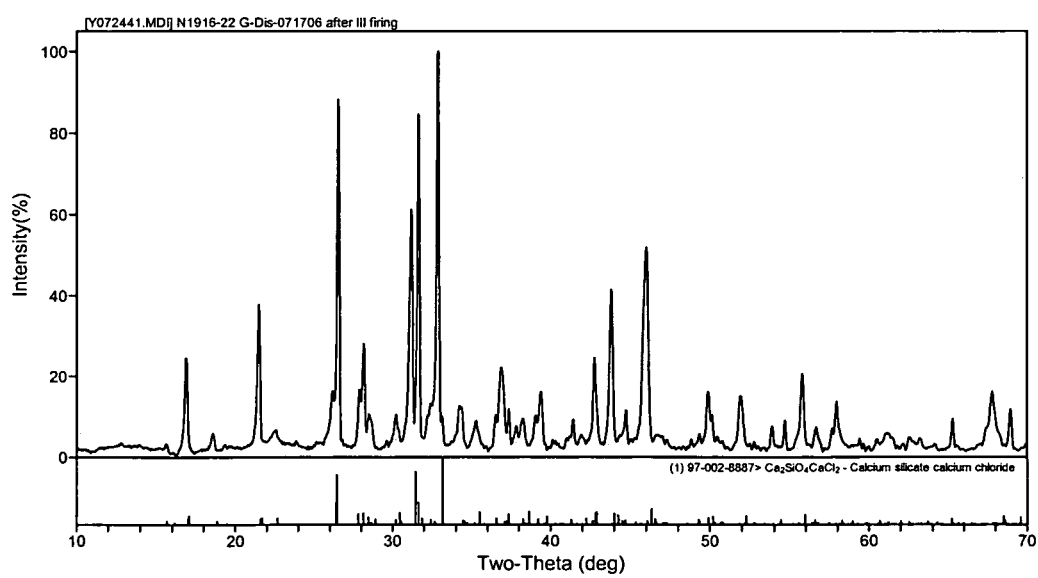
FIG. 6 shows an X-ray diffraction for a phosphor Example 1 of the present invention.
Figure 7:
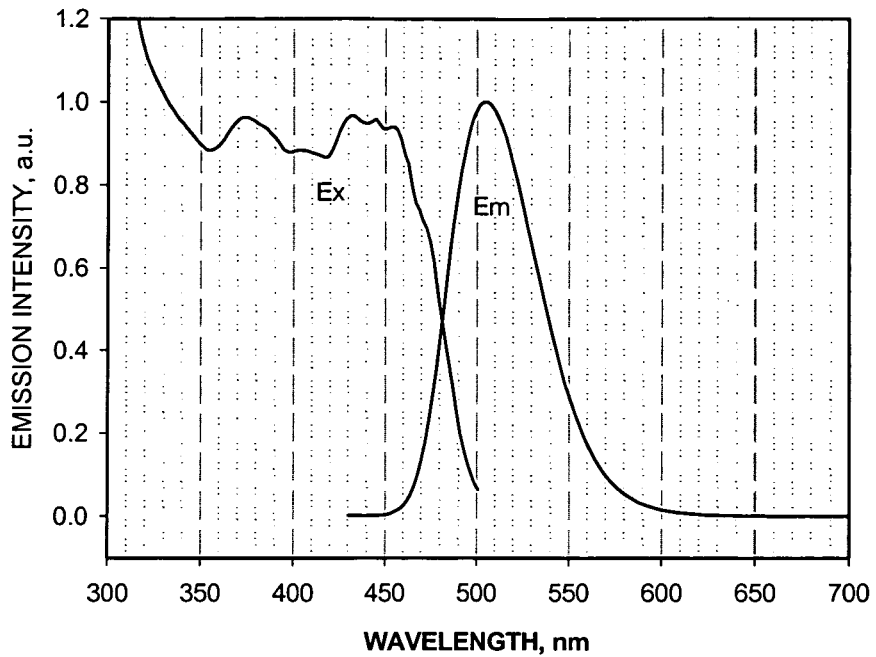
FIGS. 7 and 9 show emission/excitation spectra for a phosphor of Example 2 and a phosphor of Example 3, respectively, of the present invention.
Figure 8:
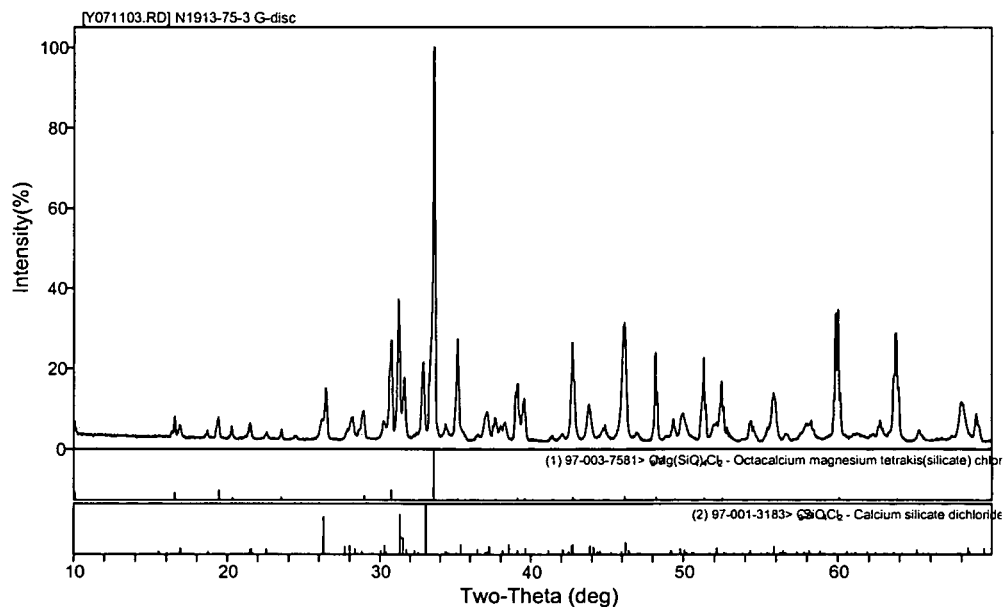
FIGS. 8 and 10 show X-ray diffractions for a phosphor of Example 2 and a phosphor of Example 4, respectively, of the present invention.

The final product (about 5 g) of Example 1 was mixed with $MgCl_2$ (2 g) and fired at about 800° C. in a forming gas for about 10 hours. The phosphor product was washed with deionized water three times and then dried at about 100° C. for about 10 hours. The fluorescence excitation and emission spectra of the phosphor are shown in FIG. 6. The XRD pattern of the phosphor is shown in FIG. 7.

Example 3

Preparation of White LED Lamp with $(Ca,Sr)_3SiO_4Cl_2:Eu^{2+}$

Figure 9:
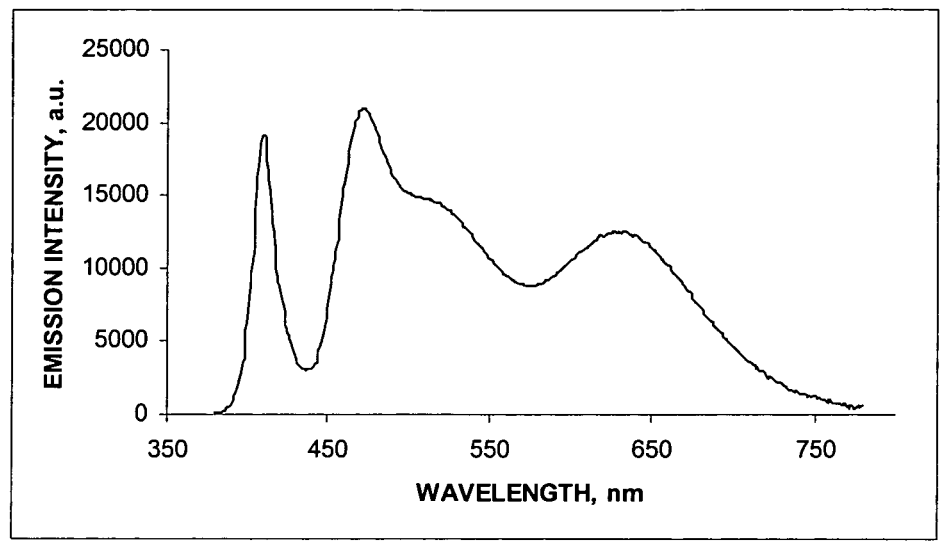

A phosphor blend was made by mixing about 0.3 g of $CaSiO_3.(SiO_2)_n:Eu^{2+},Mn^{2+}, I^-$ (red-emitting), about 0.3 g of $CaSiO_3.(SiO_2)_n:Eu^{2+}, I^-$ (blue-emitting) and about 0.6 g of the phosphor prepared in Example 1 (green emitting). After mixing, about 0.04 g of the phosphor blend was added to about 0.2 g of silicone resin and mixed to give a slurry containing about 20 wt % of the phosphor blend. On the other hand, a 410 nm-emitting LED chip mounted in a reflector was coated with a layer of clear silicone resin. After the silicone layer was cured, the slurry was applied onto the layer of the cured silicone over the LED and then cured at 150° C. for about 9 hours to provide a LED lamp with a layer of phosphor slurry separate from the LED chip as shown in FIG. 2. FIG. 9 shows the emission spectrum of the LED lamp made with the phosphor blend. The LED lamp is characterized by chromaticity coordinates x=0.3167, y=0.3477, CCT=6197 K and Ra=0.83.

Example 4

Preparation of LED Lamp with $(Ca,Sr)_8(SiO_4)_4Cl_2:Eu^{2+}$

Figure 10:
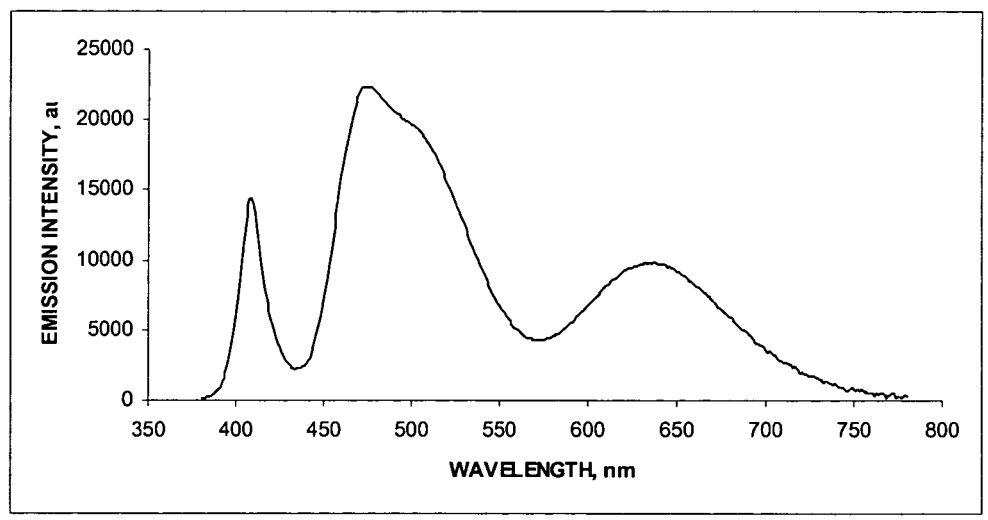

A phosphor blend was made by mixing about 0.3 g of $CaSiO_3.(SiO_2)_n:Eu^{2+},Mn^{2+}, I^-$ (red-emitting), about 0.3 g of $CaSiO_3.(SiO_2)_n:Eu^{2+}, I^-$ (blue-emitting) and about 0.5 g of $(Ca,Sr)_8Mg(SiO_4)_4Cl_2:Eu^{2+}$ prepared in Example 2 (green-emitting) resulting in a phosphor blend with an R:G:B ratio of 1:1.6:1. After mixing, about 0.04 g of the blend was mixed with about 0.2 g of silicone resin to give a slurry containing about 20 wt % of the blend. On the other hand, a 410 nm-emitting LED chip mounted in a reflector was coated with a layer of clear silicone resin. After the silicone layer was cured, the phosphor slurry was applied onto the layer of the cured silicone over the LED and then cured at 150° C. for about 9 hours to give a LED lamp with a layer of phosphor slurry separate from the chip as shown in FIG. 2. FIG. 10 shows the emission spectrum of the LED lamp made with the phosphor blend. The LED lamp is characterized by chromaticity coordinates x=0.2692, y=0.3294, CCT=9264 K and Ra=0.69.

Example 5

Preparation of Oxide Coated Phosphor

A phosphor of the present invention, such as the phosphor product of Example 1 or 2, can be coated with an oxide coating by suspending about 100 grams of the phosphor in about 340 grams of 2-propanol containing about 34 grams of tetraethoxysilane to form a suspension. The suspension then is sonicated for about 10 minutes. Water (about 24 grams) with a pH=about 8.0 (adjusted with ammonium hydroxide) then is added to the suspension. The suspension then is incubated and stirred for about 16 hours. The solids then are filtered out and dried at about 50° C. for about 4 hours. The resultant powder is baked at about 150° C. under $N_2$ gas for about 1 hour to provide the coated phosphor. Then the coated phosphor can be kept at about 85° C. and about 85% relative humidity as a stability test. The fluorescent emission of a test sample of the coated phosphor can be measured at different times. Fluorescent emission of the coated phosphor can be measured using a SPEX-1680 Fluorimeter (ISA Company, Edison, N.J.), using a xenon lamp (at about 460 nm) to excite the test sample and a photo multiplier to detect the emission.

Publications and references, including but not limited to patents and patent applications, cited in this specification are herein incorporated by reference in their entirety in the entire portion cited as if each individual publication or reference were specifically and individually indicated to be incorporated by reference herein as being fully set forth. Any patent application to which this application claims priority is also incorporated by reference herein in the manner described above for publications and references.

While this invention has been described with an emphasis upon some embodiments, it will be obvious to those of ordinary skill in the art that variations in the embodiments can be used and that it is intended that the invention can be practiced otherwise than as specifically described herein. Accordingly, this invention includes all modifications encompassed within the spirit and scope of the invention as defined by the claims that follow.

What is claimed:

1. A lighting device comprising:
   a) a light source that emits light at wavelengths of at least about 300 nm; and
   b) at least one phosphor having a formula selected from the group consisting of:
      1) $(M1_xM2_{1-x})_2LiSiO_4X:A$;
      2) $(M1_xM2_{1-x})_{10}(SiO_4)_3(SO_4)_3X_2:A$; and
      3) $(M1_xM2_{1-x})_4(SiO_4)(SO_4)X_2:A$;
   wherein:
      M1 and M2 are each independently at least one metal ion selected from the group consisting of $Mg^{2+}$, $Ca^{2+}$, $Sr^+$, $Ba^{2+}$, $Zn^{2+}$ and $Cd^{2+}$;
      X is a value from about 0.001 to about 1;
      X is at least one halide ion in ionic form;
      A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$;
      if the phosphor has the formula $(M1_xM2_{1-x})_2LiSiO_4X$:A, and M1 is $Sr^{2+}$, x is 1 and X is fluoride or M2 is $Sr^{2+}$, x is 0 and X is fluoride, then A is not $Eu^{2+}$; and
      the phosphor is capable of absorbing at least a portion of the light emitted from the light source;
      the phosphor modifies a chromaticity of the portion of the light absorbed from the light source; and
      the phosphor emits light of a longer wavelength than that of the light absorbed from the light source.

2. The lighting device of claim 1, wherein the lighting device produces white light.

3. The lighting device of claim 1, wherein the light source is a light emitting diode (LED).

4. The lighting device of claim 3, wherein:
   the LED comprises a quantum well structure having a light emitting layer sandwiched between a p-type clad layer and an n-type clad layer.

5. The lighting device of claim 4, wherein:
   the p-type clad layer is formed of $Al_qGa_{1-q}N$, wherein $0<q<1$; and
   the n-type clad layer is formed of $Al_rGa_{1-r}N$, wherein $0\le r<1$.

6. The lighting device of claim 5, wherein the LED comprises a light emitting layer containing indium and at least one quantum well structure.

7. The lighting device of claim 6, wherein the at least one quantum well structure comprises:
   (i) at least one well layer of InGaN and at least one barrier layer of GaN;
   (ii) at least one well layer of InGaN and at least one barrier layer of AlGaN; or
   (iii) at least one well layer of AlInGaN and at least one barrier layer of AlInGaN;
wherein for each quantum well structure recited by (i), (ii), and (iii), at least one barrier layer has a band gap energy larger than a band gap energy of at least one well layer.

8. The lighting device of claim 1, wherein for the at least one phosphor:
   M1 and M2 are each independently $Ca^{2+}$, $Sr^{2+}$, $Ba^{2+}$ or a combination thereof;
   X is fluoride, chloride, bromide or a combination thereof; and
   A is $Eu^{2+}$, $Mn^{2+}$, $Ce^{3+}$ or a combination thereof.

9. The lighting device of claim 1, wherein for the at least one phosphor:
   M1 is $Ca^{2+}$;
   M2 is $Sr^{2+}$, $Ba^{2+}$ or a combination thereof;
   X is fluoride, chloride or a combination thereof; and
   A is $Eu^{2+}$, $Mn^{2+}$, $Ce^{3+}$ or a combination thereof.

10. The lighting device of claim 1, further comprising at least one additional phosphor having formula (I):

$$CaSiO_3.(SiO_2)_n:R\in,Y \qquad (I)$$

wherein:
   $R\in$ is at least one activator ion selected from the group consisting of $Eu^{2+}$ and $Mn^{2+}$; and
   Y is at least one halide ion in ionic or atomic form or is absent.

11. The lighting device of claim 10, wherein the at least one additional phosphor comprises formula (II):

$$CaSiO_3.(SiO_2)_n:Eu^{2+},I^- \qquad (II)$$

and the additional phosphor emits blue light.

12. The lighting device of claim 10, wherein the at least one additional phosphor comprises formula (III):

$$CaSiO_3.(SiO_2)_n:Eu^{2+},Mn^{2+},I^- \qquad (III)$$

and the additional phosphor emits red light.

13. The lighting device of claim 10, further comprising at least two additional phosphors, wherein:
   one phosphor comprises formula (II):

$$CaSiO_3.(SiO_2)_n:Eu^{2+},I^- \qquad (II)$$

the second phosphor comprises formula (III):

$$CaSiO_3.(SiO_2)_n:Eu^{2+},Mn^{2+},I^- \qquad (III).$$

14. The lighting device of claim 13, wherein the lighting device emits white light.

15. A lighting device comprising:
   a) a light source that emits light at wavelengths of at least about 300 nm, wherein the light source is a light emitting diode (LED); and
   b) at least one phosphor having a formula selected from the group consisting of:
      1) $(M1_xM2_{1-x})_2LiSiO_4X:A$;
      2) $(M1_xM2_{1-x})_{10}(SiO_4)_3(SO_4)_3X_2:A$;
      3) $(M1_xM2_{1-x})_4(SiO_4)(SO_4)X_2:A$; and
   wherein:
      M1 and M2 are each independently at least one metal ion selected from the group consisting of $Mg^{2+}$, $Ca^{2+}$, $Sr^+$, $Ba^{2+}$, $Zn^{2+}$ and $Cd^{2+}$;
      x is a value from about 0.001 to about 1;
      X is at least one halide ion in ionic form;
      A is at least one activator ion selected from the group consisting of $Eu^{2+}$, $Yb^{2+}$, $Mn^{2+}$, $Bi^{3+}$, $Pb^{2+}$, $Ce^{3+}$, $Nd^{3+}$, $Pr^{2+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$ and $Yb^{3+}$;
      if the phosphor has the formula $(M1_xM2_{1-x})_2LiSiO_4X:A$, and M1 is $Sr^{2+}$, x is 1 and X is fluoride, then A is not $Eu^{2+}$;
      the phosphor is capable of absorbing at least a portion of the light emitted from the light source;
      the phosphor modifies a chromaticity of the portion of the light absorbed from the light source; and
      the phosphor emits light of a longer wavelength than that of the light absorbed from the light source;
      wherein the lighting device produces white light.

16. The lighting device of claim 1, wherein the phosphor further comprises at least one layer of a coating that comprises at least one oxide.

17. The lighting device of claim 15, wherein the phosphor further comprises at least one layer of a coating that comprises at least one oxide.

18. The lighting device of claim 5, wherein the p-type clad layer has a band gap that is larger than the band gap of the n-type clad layer.

19. The lighting device of claim 7, wherein the well layer has a thickness of at most about 100 angstroms.

* * * * *